(12) United States Patent
Hammerschmidt et al.

(10) Patent No.: US 10,644,708 B2
(45) Date of Patent: May 5, 2020

(54) METHOD AND APPARATUS FOR CALIBRATION OF VOLTAGE CONTROLLED OSCILLATOR

(71) Applicant: Apple Inc., Cupertino, CA (US)

(72) Inventors: Joachim S. Hammerschmidt, Mountain View, CA (US); Robert G. Lorenz, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 302 days.

(21) Appl. No.: 15/676,080

(22) Filed: Aug. 14, 2017

(65) Prior Publication Data

US 2018/0097521 A1    Apr. 5, 2018

Related U.S. Application Data

(60) Provisional application No. 62/402,553, filed on Sep. 30, 2016.

(51) Int. Cl.
| | |
|---|---|
| *H03L 7/089* | (2006.01) |
| *H03C 3/09* | (2006.01) |
| *H03L 7/099* | (2006.01) |
| *H03L 7/10* | (2006.01) |
| *H03L 7/18* | (2006.01) |
| *H03L 7/08* | (2006.01) |

(Continued)

(52) U.S. Cl.
CPC ......... *H03L 7/0893* (2013.01); *H03B 5/1243* (2013.01); *H03B 5/1265* (2013.01); *H03C 3/095* (2013.01); *H03C 3/0925* (2013.01); *H03C 3/0933* (2013.01); *H03C 3/0958* (2013.01); *H03C 3/0991* (2013.01); *H03L 7/0805* (2013.01); *H03L 7/0996* (2013.01); *H03L 7/104* (2013.01); *H03L 7/105* (2013.01); *H03L 7/18* (2013.01); *H03L 7/189* (2013.01); *H03B 2201/025* (2013.01); *H03B 2201/0266* (2013.01); *H03J 2200/10* (2013.01); *H03L 2207/06* (2013.01)

(58) Field of Classification Search
CPC .......................... H03B 5/1243; H03B 5/1265
See application file for complete search history.

(56) References Cited

U.S. PATENT DOCUMENTS 7,148,760 B2 *  12/2006  Vaananen ................. H03J 7/10
                                                                        331/25
7,924,101 B1    4/2011  Crawford
(Continued)

*Primary Examiner* — Jeffrey M Shin
(74) *Attorney, Agent, or Firm* — Kowert, Hood, Munyon, Rankin & Goetzel, P.C.; Erik A. Heter

(57) ABSTRACT

A method and apparatus for performing a two-point calibration of a VCO in a PLL is disclosed. The method includes determining a first steady state tuning voltage of the VCO with no modulation voltage applied. Thereafter, an iterative process may be performed wherein a modulation voltage is applied to the VCO (along with the tuning voltage) and a modified divisor is applied to the divider circuit in the feedback loop. During each iteration, after the PLL is settled, the tuning voltage is measured and a difference between the current value and the first value is determined. If the current and first values of the turning voltage are not equal, another iteration may be performed, modifying at least one of the modulation voltage and the divisor, and determining the difference between the current and first values of the tuning voltage.

17 Claims, 20 Drawing Sheets

(51) Int. Cl.
*H03B 5/12* (2006.01)
*H03L 7/189* (2006.01)

(56) References Cited

U.S. PATENT DOCUMENTS

| | | | |
|---|---|---|---|
| 8,384,450 B2 * | 2/2013 | Kuramochi | H03C 3/0925 327/147 |
| 9,350,296 B1 | 5/2016 | Waheed | |
| 9,583,832 B2 | 2/2017 | Ek | |
| 2015/0146835 A1 * | 5/2015 | Gauthier | H04L 7/0331 375/376 |

* cited by examiner

METHOD AND APPARATUS FOR CALIBRATION OF VOLTAGE CONTROLLED OSCILLATOR

PRIORITY INFORMATION

This application claims priority to U.S. provisional patent application Ser. No. 62/402,553, entitled "Method and Apparatus for Calibration of Voltage Controlled Oscillator," filed Sep. 30, 2016, which is hereby incorporated by reference in its entirety as though fully and completely set forth herein.

BACKGROUND

Technical Field

This disclosure is directed to voltage-controlled oscillators, and more particularly, methods for calibrating a voltage controlled-controlled oscillator.

Description of the Related Art

Voltage controlled oscillators, or VCOs, are well-known circuits for generating periodic signals. The use of VCOs in electronic circuits and systems is widespread. Common uses for VCOs includes the generation of carrier signals in radio circuits, clock generation, and other applications in which periodic signals are utilized. One widely used circuit in which a VCO may be used is a phase locked loop (PLL).

A VCO may provide a periodic (e.g., sinusoidal) signal based on a voltage that is input thereto. This voltage, referred to as the tuning voltage, may be increased to cause a corresponding increase in the frequency of the output signal, or decreased to cause a corresponding decrease to the frequency of the output signal. The ratio of the output signal frequency change to the tuning voltage change may be referred to as the gain of the VCO.

A free-running VCO typically lacks the desired precision, in terms of output signal frequency, for certain types of applications such as carrier signal generation in wireless systems. Accordingly, a VCO may be used as part of a PLL in such an application. Using a VCO in the context of a PLL results in a feedback loop that compensates for factors such as temperature drift, thus maintaining the frequency of the output signal at a desired frequency. Various calibration procedures may be performed to ensure that a VCO provide the output signal at the desired frequency based on inputs to the PLL.

SUMMARY

A method and apparatus for calibrating a VCO is disclosed. In one embodiment, a VCO is implemented in a phase-locked loop (PLL). The PLL includes a reference oscillator to generate a reference signal, and a detector circuit coupled to receive the reference signal. The detector circuit is also coupled to receive a signal from divider circuit. The VCO is configured to generate a periodic output signal based in part on a tuning voltage. The tuning voltage value is based in part on the frequency of the reference signal. The VCO also includes a modulation voltage input. A non-zero voltage applied to the modulation voltage input may cause an instantaneous change to the frequency of the output signal generated by the VCO. The divisor provided to the divider circuit may also be modified. A control circuit is coupled to provide both a modulation voltage to the VCO and a modified divisor to the divider in order to cause frequency changes to the VCO output signal.

In one embodiment, the control circuit is capable of performing a calibration routine. The calibration routine includes initially providing a modulation voltage of zero volts to the VCO and an unmodified divisor to the divider circuit. After the PLL settles, the tuning voltage provided to the VCO is measured. Thereafter, a non-zero modulation voltage and a modified value of the divisor are provided to the VCO and the divider, respectively. After the PLL settles again, the tuning voltage is once again measured, and its value is compared to the initially measured tuning voltage (i.e. that which was measured when the modulation voltage was zero and the divisor was unmodified). Based on the difference between the initially measured tuning voltage and the updated value of the same, at least one of the modulation voltage and the divisor are changed to new values and again applied to the VCO and the divider circuit, respectively. This may be repeated a number of times, each time providing new values of at least one of the modulation voltage and the divisor value.

In one embodiment, a method includes determining an initial steady state tuning voltage of the VCO with no modulation voltage applied. Thereafter, and iterative process may be performed wherein a modulation voltage is applied to the VCO (along with the tuning voltage) and a modified divisor is applied to the divider circuit in the feedback loop. During each iteration, after the PLL is settled, the tuning voltage is measured and a difference between the current value and the initial value. Based on the difference, at least one the modulation voltage and the modified divisor are adjusted, and another iteration is performed. Iterations may be performed until the calibration is complete. Using the calibrated values, the frequency of the VCO may be changed virtually instantaneously during operation while having little, if any effect on the stability of the loop, as the tuning voltage may remain substantially unchanged.

BRIEF DESCRIPTION OF THE DRAWINGS

The following detailed description makes reference to the accompanying drawings, which are now briefly described.

Figure 1:
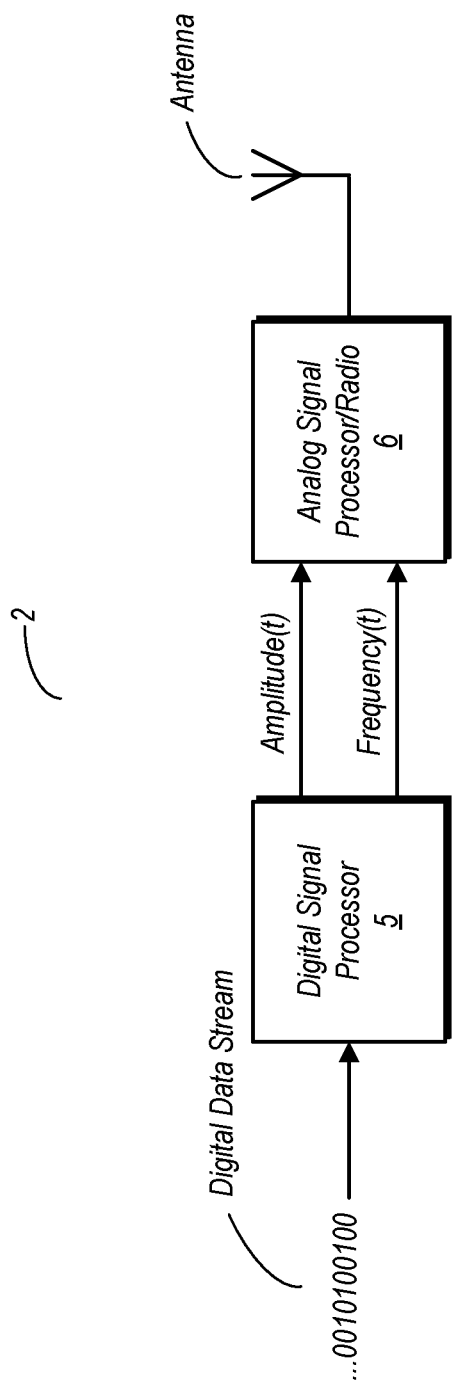
FIG. 1 is a block diagram illustrating one embodiment of a wireless transmitter incorporating one embodiment of a voltage-controlled oscillator (VCO) in accordance with the disclosure.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Table of Signals and Symbols:
The following table lists symbols used in this disclosure.

TABLE 1

| Symbol | Description | Unit |
|---|---|---|
| s(t) | Overall modulated final antenna input signal at RF as a function of time | V |
| A(t) | Time-variant signal amplitude | V |
| θ(t) | Time-variant signal phase of overall RF signal (includes carrier oscillations) | rad |
| $\phi_{mod}$(t) | Modulated (signal-contents bearing) phase term | rad |
| $f_{cent}$ | RF center frequency of the signal | Hz |
| I(t), Q(t) | In-phase and quadrature components of RF signal | V |
| $f_c$(t) | Modulated carrier frequency over time | Hz |
| $f_{vco}$ | Oscillation frequency of Voltage Controlled Oscillator (VCO) | Hz |
| L, C | Inductance and Capacitance (e.g., of VCO tank) | H, F |
| $k_{vco}$ | VCO gain | MHz/V |
| $f_{vco,0}$ | VCO frequency with all modulation ports set to "zero" | Hz |
| $v_{tune}$ | Tuning voltage at tuning input of VCO | V |
| $f_{xo}$ | Frequency of crystal oscillator ("XO") reference | F |
| N | Divide ratio in feedback path of PLL | 1 |
| $f_D$ | Frequency at output of divider in feedback path of PLL | Hz |
| $N_{cent}$ | Divide ratio in PLL feedback path representing RF channel center | 1 |
| $k_{v,tune}$ | VCO gain for tuning port of VCO | MHz/V |
| $k_{v,mod}$ | VCO gain for modulation port of dual-port VCO | MHz/V |
| N(t) | Time variant divide ratio in PLL feedback path | 1 |
| $N_{mod}$(t) | Modulation portion of time-variant divide ratio in PLL feedback path | 1 |
| $v_{mod}$ | Voltage at secondary (modulation) port of dual-varactor VCO | V |
| $v_{m,1/2/3}$ | 3 specific exemplary values of $v_{mod}$ | V |
| $v_{t,1/2/3}$ | 3 specific exemplary values of $v_{tune}$ | V |
| F_mod | Digital representation of desired frequency shift (for desired VCO frequency modulation) | n/a |
| s_mod | Digital representation of desired varactor voltage (for desired VCO frequency modulation) before scaling with | n/a |
| u_mod | Digital representation of desired varactor voltage after scaling with VCO gain compensation scale factor g_scale | |
| u_tune | Digital (A/D converted) representation of $v_{tune}$ | |
| g_scale | Digital scale factor to compensate for VCO gain (determined via calibration) | |
| c_speed | Digital Speed Constants (or adaptation step size) | |
| delta_utune | Digital representation of difference between two measured tuning voltages | |
| u_tune_avg1, 2 | Average values of digital representation u_tune of the tuning voltage $v_{tune}$, in two measurement intervals, 1 and 2 | |
| K0, 1, 2, 3 | Measurement "Knots" (Set of values chose for F_mod) | |
| p0, 1, 2, 3, 4 | Coefficients of polynomial models of VCO characteristic | |
| TPM | Two-Point Modulation | |
| PLL | Phase Locked Loop | |
| LF | Loop Filter (In PLL) | |
| VCO | Voltage Controlled Oscillator | |

Overview

The present disclosure is directed to a wireless transmitter, a phase-locked loop (PLL), a voltage controlled oscillator (VCO), and a method for calibration the VCO. The wireless transmitter may be an ultra-low power wireless transmitter suitable for implementations of the Bluetooth™ wireless standard and other wireless systems targeted for, e.g., use in portable and wearable consumer products.

The disclosure contemplates a VCO gain calibration method for a two-point modulator (TPM) that may be used in, among other applications, the Bluetooth™ wireless transmitter architecture. The hybrid digital/analog calibration methodology may facilitate wireless transmissions of very high fidelity as manifested in metrics such as error vector magnitude (EVM), modulation accuracy, or spectral mask, by self-adjusting properties of the transmitter across varying operating conditions. Such operating conditions may include:

a) common drifts of the radio transmitter's characteristics over temperature, battery supply voltage, and over time including device aging; and
b) part-to-part variation of the VCO's physical device properties over millions of manufactured wireless chips.

The methodology as disclosed herein may achieve the above with a mechanism that is relatively low in complexity that may precisely align the scaling of the two injection points of the TPM.

A starting point is a two-point Modulator with its two injection ports to enforce a frequency shift: The VCO's (secondary) direct-modulation port and the PLL's loopback divider port in order to align, via scaling, the signal on the direction modulation port with that on the divider path. The alignment may be accomplished by stimulating the TPM in two operating points, one where no frequency shift is induced on either of the ports, one where a finite (non-zero) frequency shift is induced on both ports. The injection to the modulation port may be scaled with an adaptive scale factor. The TPM's response to each stimulus may be measured, e.g., by tapping the tuning voltage on the VCO's primary input with an analog-to-digital converter (ADC) and reading off the steady-state voltage in both scenarios. The difference between the readings in the two operating points may be used to adjust the adaptive scale factor of the direct modulation path. After repeated measurements and corresponding adjustment of the adaptive scale factor, the difference in the measured tuning voltage goes to zero and the scale factor converges to its final, desired value.

In one embodiment, the non-zero measurements and corresponding calibration steps of the adaptive scale factor are conducted for four operating points, stimulating the TPM and VCO away from the linear region and then calculating the final scale factor for the center of the characteristic via interpolation. Embodiments are possible and contemplated wherein the calibration measurements are used to compute and evaluate a polynomial compensation model in order to accomplish predistortion of non-linear VCO behavior for waveforms exercising large frequency swings. Finally, a calibration and compensation structure may be derived where channel scaling (expansion and compression) is used during calibration and data path operation to make the calibration approach effective for frequency hopping wireless systems.

Background:

Transmit signals and s(t) radiated from an antenna in a wireless system can, in essence, be written in the following general terms to describe the time varying voltage at the antenna port:

$$(t)=A(t)\sin(\theta(t))  \quad [\text{Eq. 1}]$$

where s (t) is the Radio Frequency (RF) signal, t is the time in seconds, A(t) is the signal's amplitude over time in units of Volt, and θ(t) is the phase over time in units of [rad]. Often, there is assumed to be a carrier frequency (or center frequency or channel center frequency) $f_{cent}$ that represents the center of the spectrum the system operates at, in addition to a time-varying phase term and $\phi_{mod}(t)$ that carries the phase portion of the desired information, so that the overall phase θ(t) is given by, $$(t)=2\pi f_{cent}+\phi_{mod}(t) \quad [\text{Eq. 2}].$$

There are various practical ways to generate signal (t) in a wireless transmitter, the most common of which being I/Q (in-phase/quadrature) modulators. In an I/Q modulator, the RF signal is initially represented in complex baseband by two signals I(t) and Q(t) and then shifted up to the RF carrier $f_{cent}$ by modulating these two baseband signals with cos( ) and -sin( ) carrier signals, respectively, and adding the two resulting components at RF, $$(t)=(t)\cos 2\pi f_{cent}+(t)\sin 2\pi f_{cent} \quad [\text{Eq. 3}].$$

Another approach to generate signal s(t) in the most general terms per Eq. (1) makes use of a polar transmitter approach, i.e., an architecture with explicit representation of the time-variant amplitude A(t) using means of directly controlling the amplitude of the power amplifier/"frontend" of the wireless transmitter. This can be combined with a direct, real-time modulation of the instantaneous carrier frequency $f_c(t)$, $$(t)=(t)\sin[2\pi \int f_c(t)dt] \quad [\text{Eq. 4}]$$

where $\int f_c(t) dt$ represents the time integral over $f_c(t)$, which along with the multiplier 2π results in the overall phase, $$(t)=2\pi \int f_c(t) dt \quad [\text{Eq. 5}].$$

If $f_c(t)$ is precisely modulated over time at a rate commensurate with the desired application, any desired phase trajectory θ(t) over time can be represented in this way. The function $f_c(t)$ may be written as a steady-state (constant) center frequency $f_{cent}$, superimposed by the time-variant (modulation) part as represented by an instantaneous frequency shift $f_{mod}(t)$, $$f_c(t)=f_{cent}+f_{mod}(t), \quad [\text{Eq. 6}].$$

A transmitter architecture utilizing this kind of direct carrier frequency modulation $f_{mod}(t)$ around a center frequency $f_{cent}$ along with explicit (circuit-level) representation of the amplitude is depicted in FIG. 1. This is the context for one embodiment of a transmitter in which the PLL discussed herein may be implemented.

FIG. 1 is a high level depiction of a wireless transmitter, including a digital signal processor 5 coupled to an analog signal processor/radio 6. Digital signal processor 5 in the embodiment shown is configured to receive a digital data stream from an upper communication layer the and drive a corresponding direct frequency modulation signal freq(t) and an explicit amplitude signal amp(t) to analog signal processing/radio 6. More specifically, the frequency modulation in the system contexts of the embodiment shown may be achieved with a two-point modulated phase locked loop (PLL), as discussed below.

Figure 2:
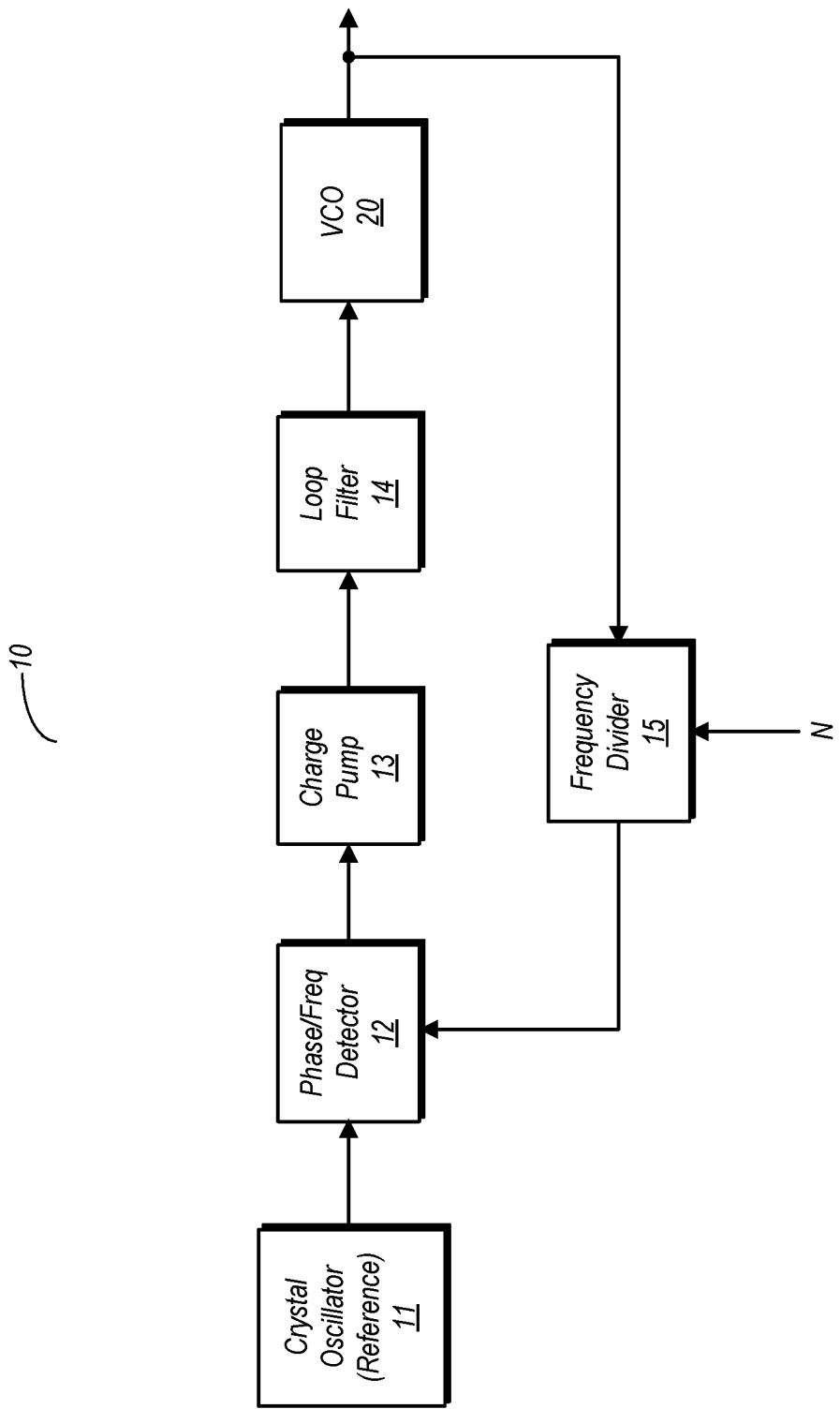
FIG. 2 is a block diagram illustrating a phase locked loop (PLL) incorporating one embodiment of a VCO in accordance with this disclosure.

FIG. 2 illustrates a basic embodiment of a PLL that may include a VCO as described herein. This type of PLL may be used in integrated radio systems for the generation of an RF signal (e.g., for "RF synthesis"). The PLL includes the normal components of PLL including a reference oscillator, a detector circuit (phase/frequency detector), a charge pump, a filter, a VCO, and a divider circuit coupled in a feedback path between the VCO output and a second input to the detector circuit. The detector circuit may detect any phase or frequency difference between the reference signal produced by the reference oscillator and the output of the divider circuit.

PLL 10 in the embodiment shown includes detector circuit 12 (which may be phase detector or frequency detector), a charge pump 13, a loop filter 14, a VCO 20, a frequency divider 15, and a crystal reference oscillator 11. As will be discussed in further detail. Below, VCO 20 may receive both a tuning voltage from loop filter 14, and a modulation voltage from another source, including during calibration.

The core of PLL 10 is VCO 20, which includes an inductive-capacitive (LC) tank circuit as a main component. An abstract representation of an LC tank circuit 205 is shown on the left-hand portion of FIG. 3. A more detailed version of LC tank circuit 205 is shown in the right hand portion, and includes three separate variable capacitances, Cm (set based on a modulation voltage, $v_{mod}$), Ct (set based on the tuning voltage) and a bulk capacitance, which can be adjusted based on the signal Sel_Cb.

Common integrated VCO's make use of a fixed (constant) inductance L and a variable capacitance C, to achieve oscillation at a desired frequency $f_{vco}$. In general terms, the VCO's oscillation frequency in Hz is given by $$f_{vco}=1/[2\pi\sqrt{(LC)}] \quad (\text{Eq. 7a})$$

where √(LC) is t is the square root of the product of the tank's inductance L and the capacitance C. To achieve tuneability of the oscillation, the total capacitance C is often made adjustable by composing it from the several sub-capacitances in the following way (see FIG. 3, right hand portion, but neglecting the dash-dotted components): To tune the VCO to the vicinity of the desired frequency, a subset of capacitors from a "bank" of capacitors is selected and configured to compose a bulk capacitance $C_b$ that produces a value of $f_{vco}$ per Eq. (7a) that is close to the desired oscillation. Depending on the number and sizes of elements available to choose from in the capacitor bank, the oscillation frequency will be more or less off of the exact desired frequency even when the best possible combination of elements is chosen, and fine-tuning the capacitance C will be required. Fine-tuning C is often accomplished by use of a varactor diode as part of the overall capacitor arrangement whose capacitance varies as a function of the control voltage (or tuning voltage) $v_{tune}$ in the framework of a PLL.

In a simplified model and neglecting non-linearities, the VCO's oscillation formula of Eq. (7a) can then be illustrated by the following formula, $$f_{vco} = f_{vco,0} + \Delta f_{vco} = f_{vco,0} + k_{vco} v_{tune} \quad \text{(Eq. 7b)}.$$

In Eq. (7b), $f_{vco,0}$ is the idle oscillation frequency, i.e., the oscillation under the assumption of $v_{tune}=0$, i.e., as characterized by the chosen bulk capacitance Cb, and $k_{vco}$ is the VCO's gain constant, or the VCO gain in short, and $\Delta f_{vco}$ is the frequency shift induced by any non-zero tuning voltage $v_{tune}$.

The quantity $K_{vco}$ is in units of MHz/V and describes the shift in the VCO's frequency as the tuning voltage $v_{tune}$ is adjusted. For the sake of simplicity of the nomenclature, it is assumed that $v_{tune}$ is centered around 0 V, i.e., that typical operating voltages will encompass negative as well as positive values; in the art of modern integrated circuits, the physical tuning voltage applied to the varactor device may be centered around a positive common mode voltage level, in which case $v_{tune}$ should be understood as the signed deviation of the control voltage from this common mode operating point by means of a voltage dependent change in capacitance that leads to a change of oscillation frequency as per Eq. (7a). With that convention in mind, Eq. (7a) allows variation of the oscillation frequency away from $f_{vco}$ in both positive and negative directions, by suitably adjusting $v_{tune}$. (Any non-zero capacitance contributed by the tuning varactor at the common mode/center operating point referred to as $v_{tune}=0$ in this text will be assumed to be accounted for as part of the capacitor bank's capacitance, $C_b$.)

Figure 4:
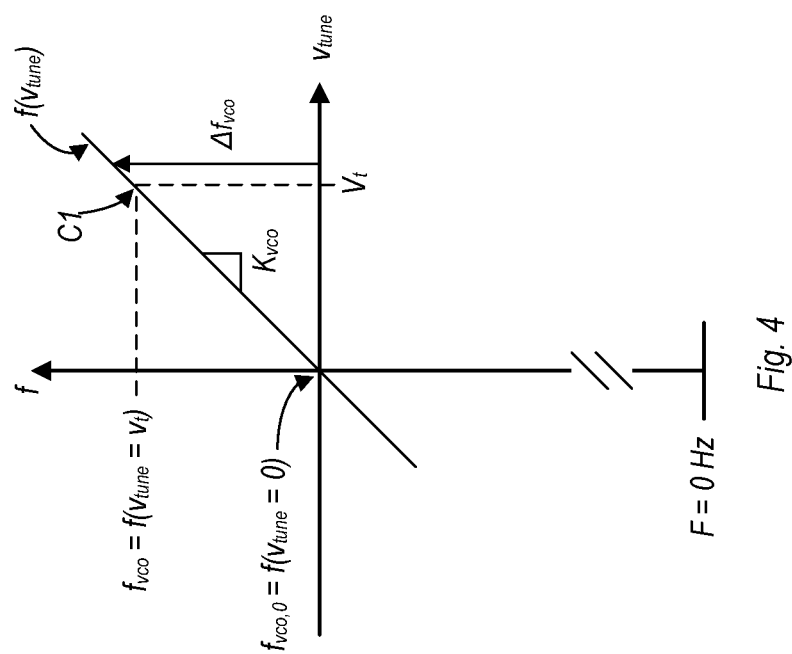
FIG. 4 is a diagram illustrating an input-output characteristic for one embodiment of a VCO.

FIG. 4 shows a graphical representation of Eq. (7a). As shown, a certain value of the tuning voltage chosen to be $v_{tune} = v_{t,1}$ induces a frequency shift $\Delta f_{vco}$, so the VCO operates at operating point "C1", where $f_{vco} = f_{vco,0} + \Delta f_{vco} = f_{vco,0} + k_{vco} v_{t,1}$. Note again that this linear relationship with the slope of $k_{vco}$ representing the VCO gain is an approximation, and higher-order effects such as compression for larger values of $v_{tune}$ play an important role in practice. The relevance of these compression effects will be discussed later in this disclosure.

A free-running VCO will typically lack the frequency stability and accuracy required for operation of a wireless system. Therefore, to force a VCO into oscillation at a desired frequency to a very high degree of accuracy and with very low noise and jitter, it is often operated in the framework of the PLL shown in FIG. 2. In a PLL, through existence of a feedback path, the tuning voltage $v_{tune}$ is constantly adjusted to align the VCO with a very clean and precise reference signal, namely, the crystal oscillator ("xo") reference that resonates at a much lower frequency $f_{xo}$. In the feedback part of the PLL, the VCO's output frequency $f_{vco}$ is divided down by a factor (divide ratio) of N, so that at the output of the divider, the frequency is $f_D = f_{vco}/N$. The value N is chosen such that $f_{xo}N$ is identical to the desired oscillation frequency, $f_{vco,Des}$. The signal at the output of the divider, at frequency $f_D$, is then compared with the xo reference in the phase/frequency detector (PFD) 12, and a charge pump (CP) 13 feeds current pulses into loop filter (LF) 14 in proportion to the frequency and phase errors between the reference signal operating at $f_{xo}$ and the divider output signal operating at frequency $f_D$. Loop filter 14 integrates and smoothens these pulses and averages out noise contributions in the loop, thereby generating and feeding to the VCO the resulting tuning voltage $v_{tune}$. The tuning voltage $v_{tune}$ is thereby made to follow and compensate for any drifts in the VCO's phase and frequency—that is, the PLL is closed, operating at the desired frequency and "phase-locked" to the xo reference.

Note that when the PLL operates in steady-state for a given choice of N, the VCO will be forced to operate at exactly $f_{vco} = f_{xo}N$. With the range of the capacitance available by adjusting the tuning varactor, $v_{tune}$ will change until this condition is fulfilled. Depending on the loop dynamics and component values (of the charge pump, LF etc.), this may take a certain amount of "settling" time.

The diagram of FIG. 4 assumes a free-running VCO. For the scenario where the VCO operates in the confines of PLL loopback, FIG. 4 can still represent the steady-state oscillation of the VCO in context of a PLL, too, namely, under the following steady-state condition:

$$f_{vco} = f_{vco,0} + \Delta f_{vco} = f_{vco,0} + k_{vco} v_t = f_{xo} N \quad \text{(Eq. 7b)}.$$

Note that this steady-state, "locked" oscillation requires that the bulk capacity $C_b$ be well-chosen for the desired operating point, so that the varactor has sufficient range to fine-Tune the frequency by the PLL's adjustment of the varactor's tuning voltage $v_{tune}$ and the varactors corresponding capacitance contribution to the LC tank.

Also note that the frequency division step in the feedback path of the PLL is often accomplished with edge counters, essentially counting N edges at its input per each edge at its output in the case of integer divide ratio N. If division by a non-integer number N is desired, a "fractional-N" structure may be used in which the nominal N is "dithered" (randomized) over a range of adjacent integer divide ratios (such as N+1 and N−1 and other neighbors), in a Sigma-Delta Modulator (SDM) fashion. By carefully sizing the probability of occurrence of these different integer divide-ratios on a microscopic time scale and by relying on the LF to average out any perturbations related to this dithering, non-integer N operation can be accomplished.

In conventional PLL operation, the choice of N reflects the transmission's desired center frequency $f_{cent}$ such that $f_{cent} = N_{cent} * f_{xo}$. Often systems have various desired center frequencies according to the "channel map" (list of center frequencies over the system's spectral band) of the wireless system, and $N_{cent}$ is chosen as a function of the $f_{cent}$ for the respective channel and remains constant for the duration of a given transmit event (such as a wireless packet).

Figure 5:
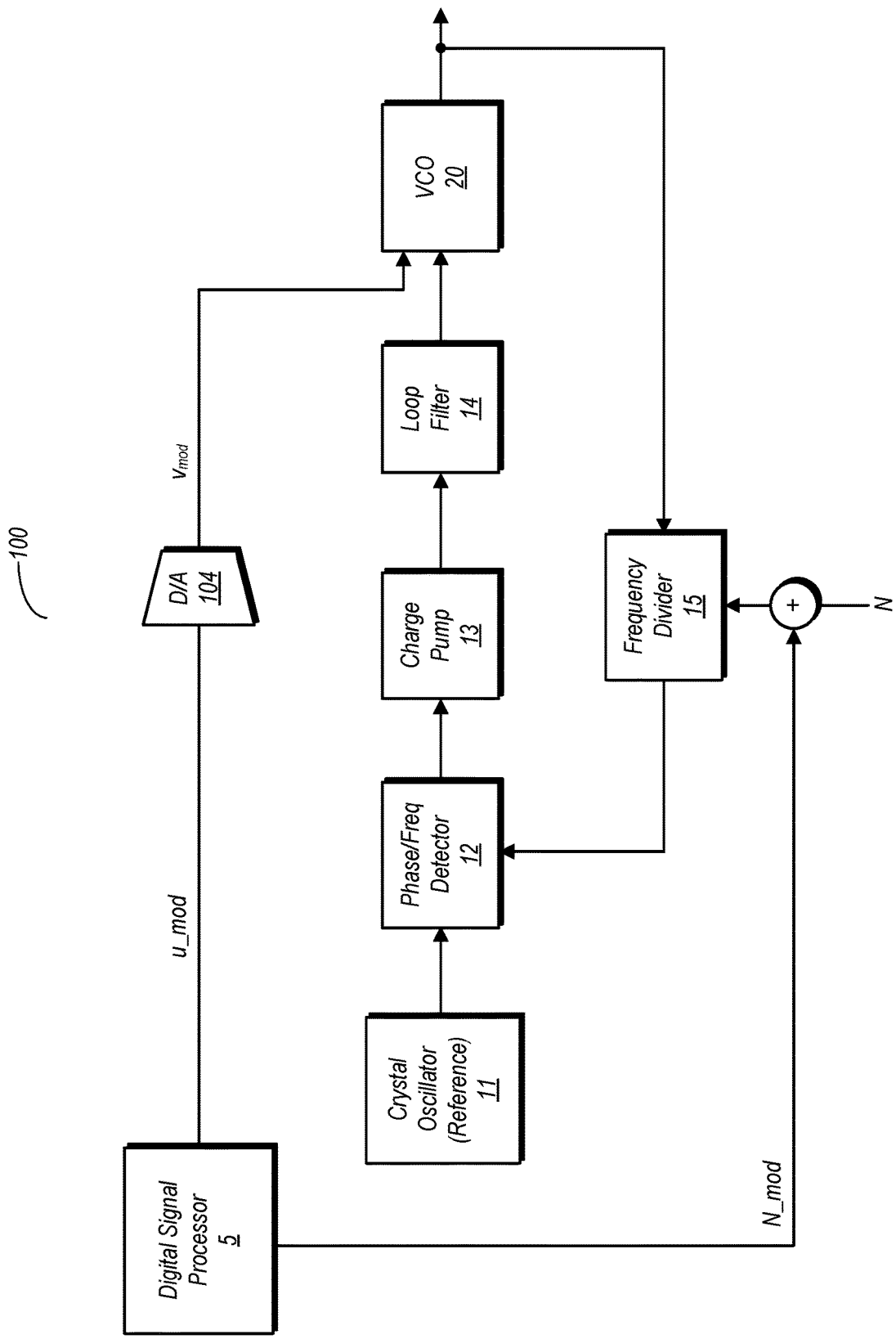
FIG. 5 is a block diagram of another embodiment of a PLL incorporating an embodiment of a VCO in accordance with this disclosure.

Two-Point Modulation:

Non-integer (or "fractional") N operation of the PLL's divider block as just described is an operational attribute when the PLL is used in a Two-Point Modulation (TPM) configuration to accomplish direct frequency modulation of the desired waveform (as is discussed further herein). The extra elements in PLL 100 as shown in FIG. 5 are the modifications to enable and calibrate and calibrate an otherwise conventional PLL for operation as a two-point modulation (TPM) structure.

Figure 6:
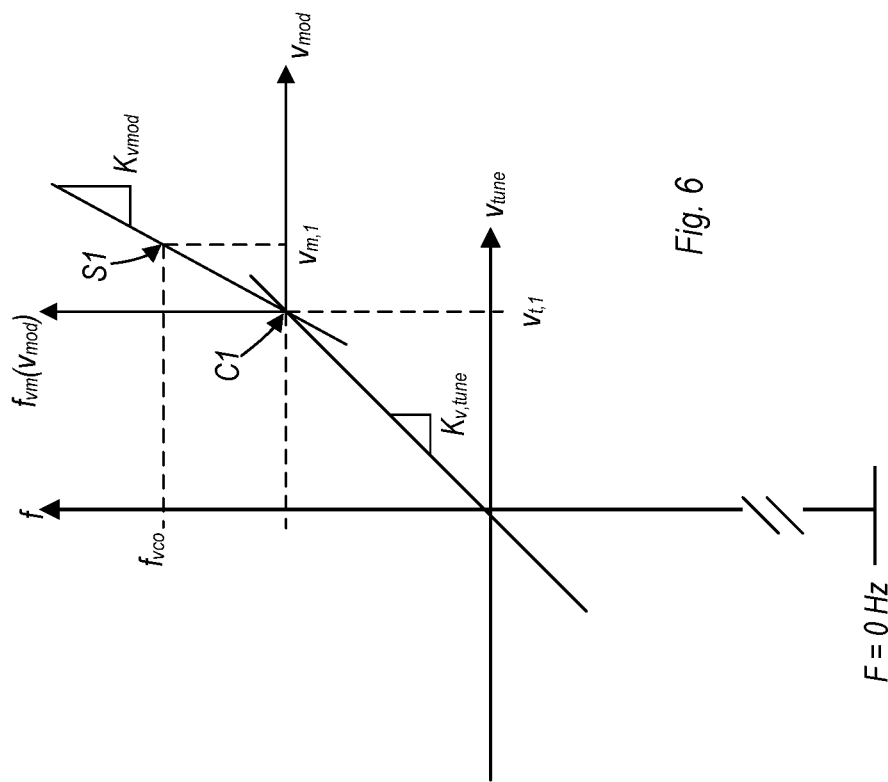
FIG. 6 is a diagram illustrating an input-output characteristic for one embodiment of a VCO in accordance with this disclosure.

The VCO in a TPM structure has two tuning ports, one for the conventional tuning voltage $v_{tune}$, and a second one for an additional, parallel tuning path, namely, a direct frequency modulation path with its associated control voltage $v_{mod}(t)$. Just like $v_{tune}$ drives the first varactor, $v_{mod}(t)$ drives a second varactor that contributes more or less capacitance to the LC tank as a function of $v_{mod}(t)$. This extra varactor element is illustrated conceptually as the capacitance component Cb in FIG. 3. Neglecting higher order effects, to first approximation, and assuming open-loop (outside of PLL) operation, the dual-port VCO's frequency formula becomes:

$$f_{vco}(t)=f_{vco,0}+k_{v,tune}v_{tune}(t)+k_{v,mod}v_{mod}(t) \quad [\text{Eq. 8}].$$

Where $k_{v,tune}$ and $k_{v,mod}$ are the two varactor's gains in MHz/V. If the two varactors are identical in their physical device properties, the two gain constants $k_{v,tune}$ and $k_{v,mod}$ may be identical. The simplified two-varactor VCO relationship of Eq. 8 is illustrated in FIG. 6 under the assumption that the two VCO gains differ (for ease of illustration), and under the assumption that the varactor voltages are set to fixed values: $v_{tune}(t)=v_{t,1}$ and $v_{mod}(t)=v_{m,1}$. Before application of $v_{mod}$, that is for $v_{mod}=0$, the VCO operates at operating point C1, where $f_{vco}=f_{vco,0}+k_{v,tune}v_{t,1}$. C1 is the "origin" for the addition of frequency shift $f_{vm}(v_{mod})=k_{v,mod}v_{mod}$. In FIG. 6, once $v_{mod}$ has been increased from 0 to $v_{mod}=v_{m,1}$, the VCO operates at $f_{vco}=f_{vco,0}+k_{v,tune}v_{t,1}+k_{v,mod}v_{m,1}$.

It is noted that the injection point into the modulation port of a VCO in a TPM structure may be referred to as the "high frequency" path of the TPM/PLL.

As a second modification to a conventional PLL structure, the divider may be driven by a (fractional) divide ratio N that is the summation of a constant $N_{mod}(t)$ representing the center of the transmission channel and a typically very small time-variant modulation of that ratio, $$N(t)=N_{cent}+N_{mod}(t) \quad [\text{Eq. 9}],$$

so that the overall (non-integer) divide ratio N(t) in the loopback path of the PLL becomes time-variant. Thus, as shown in FIG. 5, digital signal processor 5 outputs a value Nmod that is summed with the value N (i.e. $N_{cent}$) in order to put the second modification into effect.

It is noted that the second injection point, at the divider, may be referred to as the "low frequency" path of the TPM/PLL.

$N_{mod}(t)$ and $v_{mod}(t)$ are used jointly to generate the desired phase modulation $\phi_{mod}(t)$ following the direct frequency modulation approach introduced in Equations (4) through (6). To that end, the desired instantaneous frequency deviation $f_{mod}(t)$ from the center frequency $f_{cent}$ is represented, and "injected" into the system, using corresponding values for both $N_{mod}(t)$ and $v_{mod}(t)$. For $N_{mod}(t)$, the underlying equality that needs to be fulfilled is $$N_{mod}(t)f_{xo}=f_{mod}(t) \quad [\text{Eq. 10}]$$

So that $N_{mod}(t)$ can easily be determined by setting $$N_{mod}(t) = \frac{f_{mod}(t)}{f_{xo}} \quad [\text{Eq. 11}]$$

as a function of the desired frequency shift $f_{mod}(t)$. For $v_{mod}(t)$ on the other hand, in the assumed simplified linear system model, the defining equality is:

$$k_{v,mod}v_{mod}(t)=f_{mod}(t) \quad [\text{Eq. 12}].$$

Assuming a perfectly known $k_{v,mod}$, and perfect linearity of the VCO gain, the voltage to be applied to the second tuning port of the VCO can be calculated as $$v_{mod}(t)=f_{mod}(t)/k_{v,mod} \quad [\text{Eq. 13}].$$

In TPM both $N_{mod}(t)$ and $v_{mod}(t)$ may accurately represent the desired frequency shift $f_{mod}(t)$ at all times. This may be illustrated by two examples where an objective is to induce a finite, time invariant, positive valued frequency shift $f_{mod}(t)$ relative to the center frequency.

In the first example, starting from $v_{mod}=0$ and $N_{mod}=0$, assume $v_{mod}$ is abruptly increased to a fixed, non-zero value to represent such a desired frequency shift $f_{mod}$ by following Eq. (13), while $N_{mod}(t)$ is kept at 0 at all times. Initially, for a very brief period of time, the VCO will correctly reflect the desired shift $f_{mod}$ per the new non-zero contribution $k_{v,mod}v_{mod}$ in Eq. 8. However, since the divide ratio N is unchanged and reflects conditions for oscillation at the channel center, the frequency at the output of the divider will deviate slightly from its original steady-state value, and will also deviate from the crystal oscillator reference, $f_{xo}$, by the same relative amount. The PLL will detect this discrepancy in the phase frequency detector and inject charge into the loop filter in proportion to this deviation. The loop will accumulate this charge and gradually increase or decrease the regular tuning voltage $v_{tune}$, shifting the VCO's frequency back towards it's original un-deviated steady-state oscillation frequency in the channel center, until the output of the divider will again be in perfect alignment with the crystal oscillator reference. Therefore, after some delay that corresponds to the loop time constant of the PLL, the non-zero injection of $v_{mod}(t)$ will be erased by an adjustment of $v_{tune}$ that eventually perfectly cancels the effect of $v_{mod}$. Thus, this approach is only able to observe the desired frequency shift at the VCO output for a very small amount of time before the feedback in the loop compensates and thus eliminates the desired effect.

In the second example, starting again from the system being in steady-state in the center of the channel, with $v_{mod}=0$ and $N_{mod}=0$, assume that $N_{mod}$ is abruptly increased to a slightly positive value to reflect the desired frequency shift $f_{mod}$ by following Eq. 11 while $v_{mod}(t)$ is kept at 0 at all times. In this scenario, the initial VCO frequency, still at the channel center, will be divided by a ratio that is slightly larger than the original ratio N, so the divider will produce a signal at frequency $f_D$ that is below $f_{xo}$. The phase/frequency detector and charge pump will create current pulses feeding into the low pass filter to counter-act the imbalance until, after some time, the low pass filter has built up enough voltage on $v_{tune}$ that the VCO's frequency is shifted by an amount that corresponds to the induced change in N. This frequency shift corresponds exactly to the desired shift $f_{mod}$. The problem, however, is the time it took to achieve this frequency shift. This time again follows the time-settling behavior of the PLL, and during this settling time, the VCO's output will deviate from the desired frequency shift $f_{mod}$.

If either of the approaches discussed in the two examples given above is pursued in insolation to represent a continuously varying frequency shift $f_c(t)$, the output of the VCO will be distorted to a degree that depends on the speed of change in $f_c(t)$ relative to the PLL's loop bandwidth. If, for instance, the target modulation represented by $f_c(t)$ and possibly A(t) has a signaling bandwidth of 1 MHz at the antenna while the PLL's loop bandwidth is 100-200 kHz, a waveform generated by either of these two approaches in isolation will typically be unrecognizable or very distorted.

The remedy, as performed in the methodology disclosed herein, is to vary both $N_{mod}$ and $v_{mod}$ at the same time so that each precisely reflects the desired frequency shift $f_c(t)$ at all times, as per Eq's (11) and (13). Then the VCO's output frequency may immediately benefit from the instantaneous shift induced by the time-varying varactor voltage $v_{mod}(t)$. At the same time, the divide ratio will follow the exact same desired shift of the oscillation frequency, diving by a correspondingly slightly larger or smaller overall ratio N as the VCO's oscillation is slightly faster or slower, so that the divider output will never be out of alignment with the reference signal provided by the crystal oscillator. The PLL may thus be in balance, with the VCO output reflecting the desired direct frequency modulation $f_c(t)$ over time with very high accuracy. However, achieving this perfect balance of the two paths with respect to the exact desired frequency shift is difficult, and is the impetus for the calibration methodology disclosed herein.

In the discussion above, including Eq. (6) and its implementation a TPM, there is an implicit assumption that the VCO is operated at the desired antenna carrier frequency and the modulation $f_{mod}$ is induced around that to achieve the desired antenna waveform. In actual circuit implementations, the VCO may not operate at the RF (antenna) carrier frequency. Instead, it may be operated at a multiple of the desired carrier frequency. For instance, to represent a carrier signal at 2.44 GHz, the VCO may operate with its center oscillation at 1.5×2.44 GHz=3.66 GHz, or at 2×2.44 GHz=4.88 GHz; this may beneficial to avoid interaction (frequency "pulling") between the strong RF/antenna signal and the VCO/PLL.

In such a more practical circuit, the oscillation at frequency $f_{vco}$ at the output of the VCO will be divided down with commonly known clock divider mechanism (edge counters etc.). In the examples example, a divide by 1.5× or by 2.×, respectively, would move the VCO output signal to the desired carrier frequency around 2.44 GHz. Since this division step between the VCO and the power amplifier/antenna moves all frequency components in the VCO output by the same factor, any desired frequency modulation $f_{mod}$ in the VCO has to be scaled by the same amount. For instance, for a 1.5× architecture, if a 200 kHz shift from the channel center frequency is desired at the antenna, a shift of 300 kHz needs to be induced in the VCO. In preceding as well as subsequent discussion, this distinction is not explicitly made. It is to be understood that any reference to $f_{mod}$ is made in the context of the respective circuit implementation and frequency scale factor present between the VCO and the antenna output.

Challenges in Two-Point Modulation:

As outlined above. 3, the two modulation (or "injection") points of the instantaneous frequency deviation $f_{mod}(t)=f_{mod,1}$ in TPM both need to accurately reflect the desired frequency shift at all times in order for a TPM not to suffer from distortion of the resulting waveform.

Figure 7:
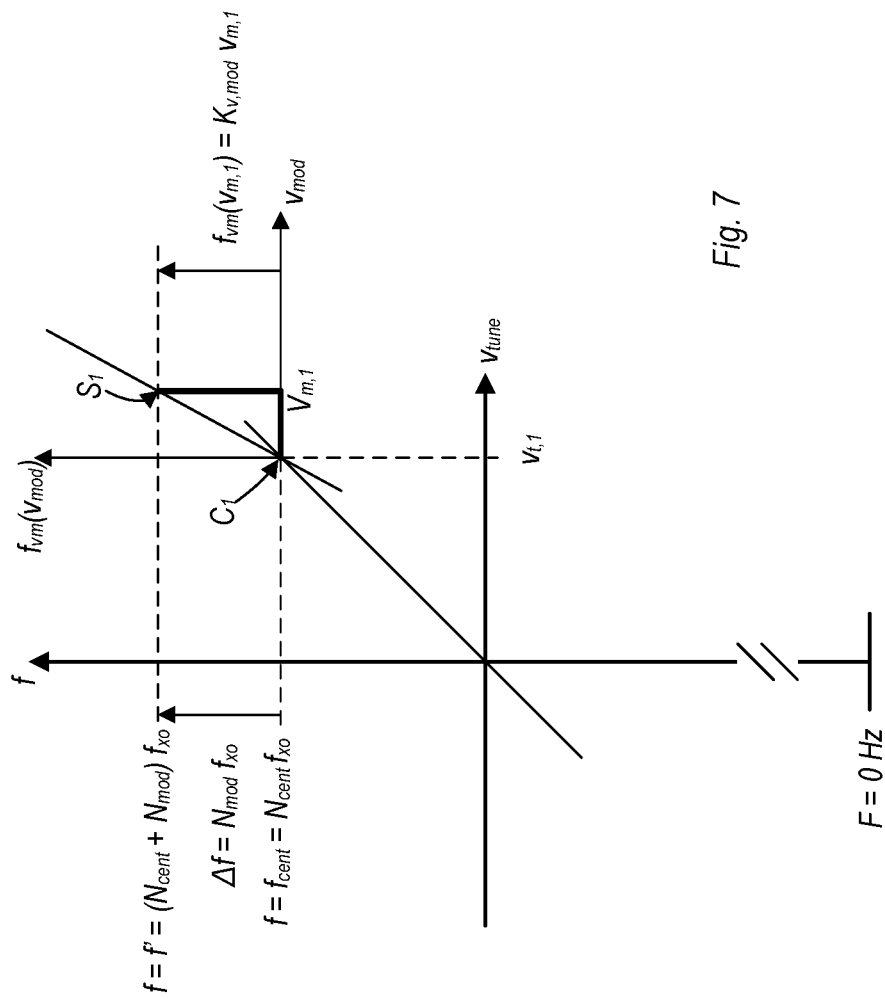
FIG. 7 is a diagram further illustrating an input-output characteristic for one embodiment of a VCO in accordance with this disclosure.

Such an alignment scenario is illustrated in FIG. 7 under the assumption that the desired instantaneous frequency shift is given by $f_{mod}(t)$ as well as under the assumption the oscillation frequency represented on the y-axis of the plot is that of a VCO operation under locked as well as steady-state conditions in the context of the two-point PLL shown previously in FIG. 5.

Before any non-zero modulation of the instantaneous frequency $f_{mod}(t)$ t is applied, the TPM PLL operates in the channel center at the node marked as "C1". At C1, the PLL's divide ratio is $N_{cent}$, representing the channel center, and the steady-state oscillation frequency is $N_{cent}f_{xo}$, enforced by the feedback loop that settles the tuning voltage to be $v_{tune}=v_{t,1}$ when the circuit is first powered up and has settled to the desired channel center; while $v_{mod}$ and $N_{mod}$ are both 0. Then the desired oscillation frequency is abruptly changed from $f_{vco}=N_{cent}f_{xo}$ to $f'_{vco}=N_{cent}f_{xo}+f_{mod}(t)=(N_{cent}+N_{mod})f_{xo}$, by adjusting the divide ratio from $N_{cent}$ to $N_{cent}+N_{mod}$, and at the same time, selecting a non-zero varactor modulation voltage $v_{mod}=v_{m,1}$ on the secondary varactor. If $v_{m,1}$ is chosen such that $v_{m,1}k_{v,mod}$ corresponds exactly to the desired shift $f_{mod}=N_{mod}f_{xo}$, and assuming a time-aligned change of $N_{mod}$ and $v_{mod}$, the PLL will be balanced with respect to the two injection points and, therefore, cause no need for resettling activity as $N_{mod}$ and $v_{mod}$ are modulated, e.g., change over time at a speed commensurate with the system's symbol rate (baud-rate), to trace the desired waveform. In the example with constant values for $v_{mod}$ and $N_{mod}$ (FIG. 7), the VCO operates in operating point S1 right after the transition and from then on.

Since the divider in the PLL loopback path is often implemented in digital logic using edge counters (typically dithered with a sigma delta modulator, SDM, to represent the time-variant and/or fractional divide ratio N), representing $N_{mod}(t)$ over time per Eq. (11) can generally be done with very high accuracy.

Significant challenged are present in suitably adjusting the system to use the desired value of $v_{mod}$. From Eq. (13), it is necessary to have sufficient knowledge of the VCO gain $k_{v,mod}$ in MHz/V, which may vary as a function of the physical (semiconductor) device property of each VCO. Over a set of integrated RF circuits generated in the same semiconductor manufacturing line, the VCO gain can vary substantially from part to part, and may also drift over operating temperature, supply voltage, and age of the device.

Misadjusting $v_{mod}$ relative to the desired frequency shift $f_{mod}(t)$ will instantly cause the PLL to be out of balance. When the PLL is out of balance, the feedback loop will try to correct for the mis-adjustment to align the VCO's divided output frequency with the $f_{xo}$, while $v_{tune}$ will try to account for the error. Meanwhile, the desired frequency shift $f_{mod}(t)$ will continue to change over time, as reflected in $N_{mod}$ and a continuously varying $v_{mod}$, so that the loop will always hunt for, but never achieve, a state of balance. The radiated waveform will suffer from distortion whose extent will be a function of the error in $v_{mod}$ in relation to a correctly chosen $v_{mod}$, a function of the bandwidth of the signal, and a function of the PLL loop dynamics. To avoid this phenomenon, the VCO gain $k_{v,mod}$ should be accurately known or implicitly taken into account, in the generation of $v_{mod}$.

One previously used approach to determine $k_{vco}$ (more specifically, $k_{v,mod}$ for the modulation varactor) is to unlock the PLL, apply various constant values of $v_{mod}$ and measure the frequency of the VCO's oscillation for these different scenarios with external equipment such as a frequency counter or spectrum analyzer. The frequency shifts measured for different values of $v_{mod}$ can be used to calculate $k_{vco}$, and the latter can be stored off in non-volatile memory for later operation of the integrated transmitter in the field.

This approach has various drawbacks. A VCO that is operated outside of a locked PLL will exhibit substantial phase noise and its frequency may drift substantially even over short periods of time. Therefore, making precise frequency measurements is very difficult. Moreover, as this measurement requires external equipment to take the measurements, it may be costly and only be performed at the time of manufacturing, but not during operation of the device once away from the factory. This can be problematic since the supply voltage used in the field may not correspond to the precise voltage used in the factory, the supply voltage in the field may drift over time, and temperature and aging effects may alter the physical properties of the VCO in a way that $k_{vco}$ itself will vary over time. Therefore, the VCO gain computed based on the coarse measurement taken at the time of manufacturing will be even less reliable as far as operation in the field is concerned. This difficulty to know the precise VCO gain as it presents itself in the field will inherently limit the accuracy of the alignment of $v_{mod}$ with the desired frequency shift $f_{mod}(t)$, and the mis-adjustment of $v_{mod}$ as a consequence of kV error causes varying degree of distortion, thereby limiting the achievable EVM and spectral mask performance or making these metrics prohibitively degraded in the limit.

Calibration Methodology:

To overcome the limitations of prior solutions, the methodology disclosed herein may precisely align the VCO modulation path in a TPM with its divider modulation path to ensure both paths follows the desired frequency shift $f_{mod}(t)$ over time whenever the frequency shift is to occur.

The methodology disclosed herein begins from the observation mentioned earlier that a Two-Point modulated PLL system that is in balance will generally have a substantially constant tuning voltage $v_{tune}$. It is understood that "substantially constant" implies that in a practical circuit, there will be thermal noise and that there may be some gradual, slow variation over time on $v_{tune}$ as the PLL is stabilizing the VCO's resonance frequency. This is the balanced TPM operating point shown in FIG. 7. The frequency shift $f_{mod}$ relative to the channel center at node C1 is reflected accurately in both $f_{mod}=v_{m,1}k_{v,mod}$ and $f_{mod}=N_{mod}f_{xo}$.

Figure 8:
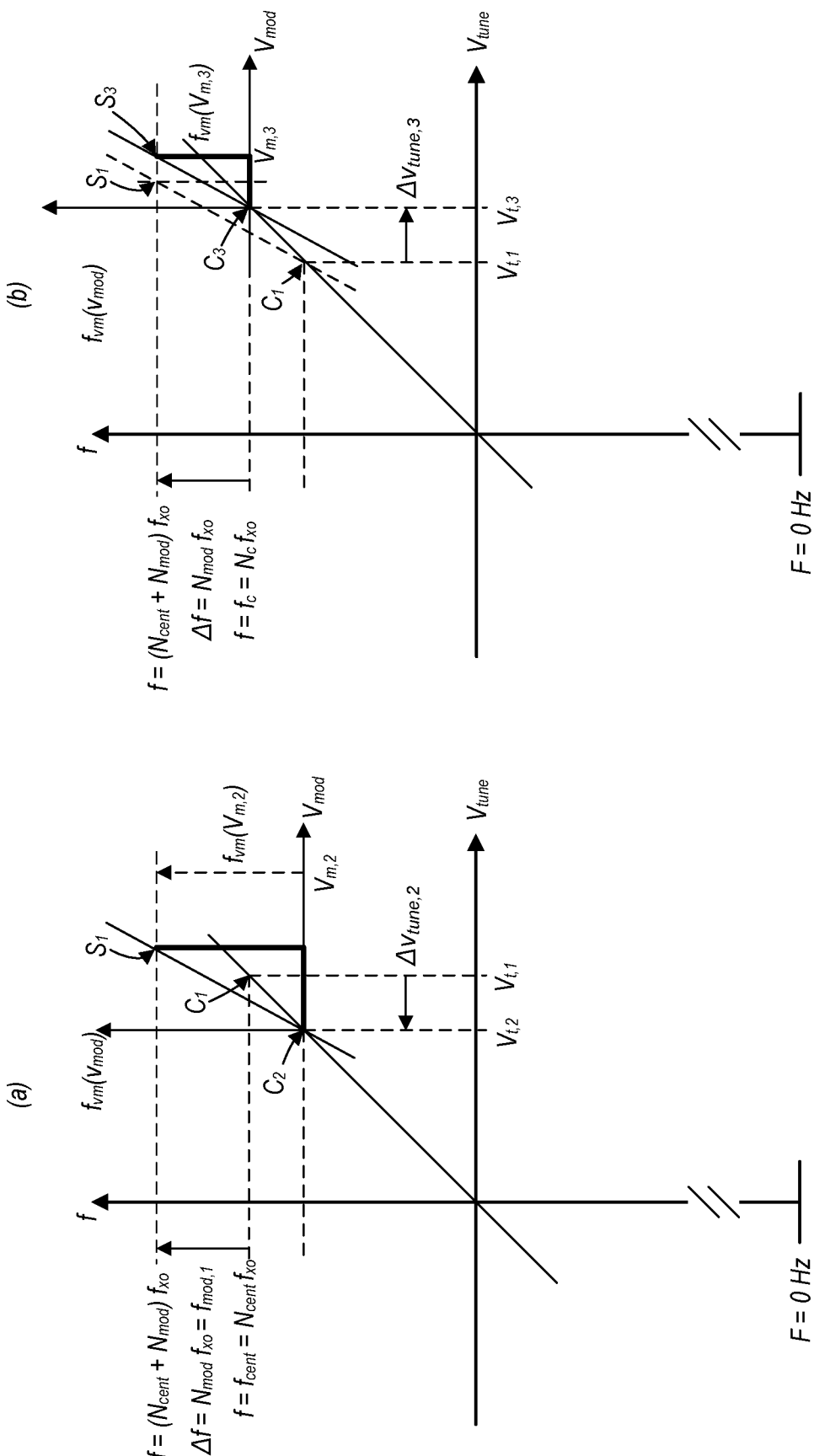
FIG. 8 are diagrams further illustrating input-output characteristics for one embodiment of a VCO in accordance with this disclosure.

Operating point C1 is also shown in FIG. 8 in parts (a) and (b) again as the channel center for which $N_{mod}=0$ and $v_{mod}=0$, while the frequency shift is still $f_{mod}=0$.

Graphs (a) and (b) of FIG. 8 illustrate what happens when the VCO modulation path's voltage $v_{mod}$ is chosen too large or too small for the desired frequency shift, respectively. This is equivalent to saying that $k_{v,mod}$ was assumed smaller than it really is, as per graph (a); and $k_{v,mod}$ was assumed larger than it really is, in graph (b).

Again, both of graphs (a) and (b) of FIG. 8 are assumed to represent the steady-state of the PLL after any settling processes. In both scenarios, the final oscillation frequency of the VCO is fixed at $(N_{cent}+N_{mod})f_{xo}$, as the numerical divide ratio is what ultimately forces the PLL into its steady-state conditions and determines the steady-state oscillation. The modulation voltage, $v_{m,2}$ in graph (a) and $v_{m,3}$ in graph (b), respectively, is also a constant for each scenario, as it is forced into the TPM as voltage driving the second VCO varactor. Consequence of over-driving or under-driving $v_{mod}$ relative to the desired frequency shift $f_{mod}(t)$ is an adjustment of the tuning voltage in the loop, as the primary varactor's purpose is precisely to adjust the effective VCO's capacitance and to take any slack when the divided VCO frequency is no longer aligned with the xo reference.

Therefore, in graph (a), the tuning voltage $v_{tune}$ has lowered from its original value $v_{t,1}$ to a smaller value $v_{t,2}$, the new origin for the incremental frequency shift accomplished by $v_{mod}$ is node C2, and the final operating point is S2. Together, $v_{tune}=v_{t,2}$ and $v_{mod}=v_{m,2}$ create a frequency shift that corresponds to the target shift $N_{mod}f_{xo}$. On the other hand, in graph (b) of FIG. 8, the tuning voltage $v_{tune}$ has increased from the original unmodulated condition and settled at $v_{t,3}$ to accommodate the new operating point where $v_{mod}=v_{m,3}$. The new origin for the incremental frequency shift of $f_{mod}$ induced by the secondary (modulation) varactor is now C3; and again the total frequency shifts represented by $v_{t,3}$ and $v_{m,3}$ line up with the numerically enforced stead-state oscillation at $(N_{cent}+N_{mod})f_{xo}$, at a resulting operating point S3.

The observations illustrated in FIGS. 7 and 8 illustrate the difference in steady-state tuning voltage between the reference point (C1) and the new modulation origins (C2, C3), referred to as $\Delta v_{tune}$ in graphs (a) and (b) of FIG. 8, between the unmodulated steady-state operating point C1 and the modulated steady-state operating points S2 and S3, respectively. In the case of a positive desired frequency shift $f_{mod}$ along with an under-estimated $k_{v,mod}$, $\Delta v_{tune}$ will be negative to re-balance the PLL, as in graph (a) of FIG. 8. In the case of an over-estimated $k_{v,mod}$, $\Delta v_{tune}$ will be positive to reintroduce the steady-state balance, as in graph (b) of FIG. 8.

As described below, the steady-state measured $\Delta v_{tune}$ may be measured and used to devise an architecture and adaptive scheme for an automatic re-balancing (calibration) scheme.

The methodology described herein makes use of this observation by taking measurements on $v_{tune}$ for different steady-state operating points, computing $\Delta v_{tune}$ between operating points, and using $\Delta v_{tune}$ to drive an adaptive loop that suitably adjusts the underlying assumption about the VCO gain $k_{v,mod}$ in the a direction that reduces the mismatch and moves the system to the perfectly balanced situation illustrated in FIG. 7.

Figure 9:
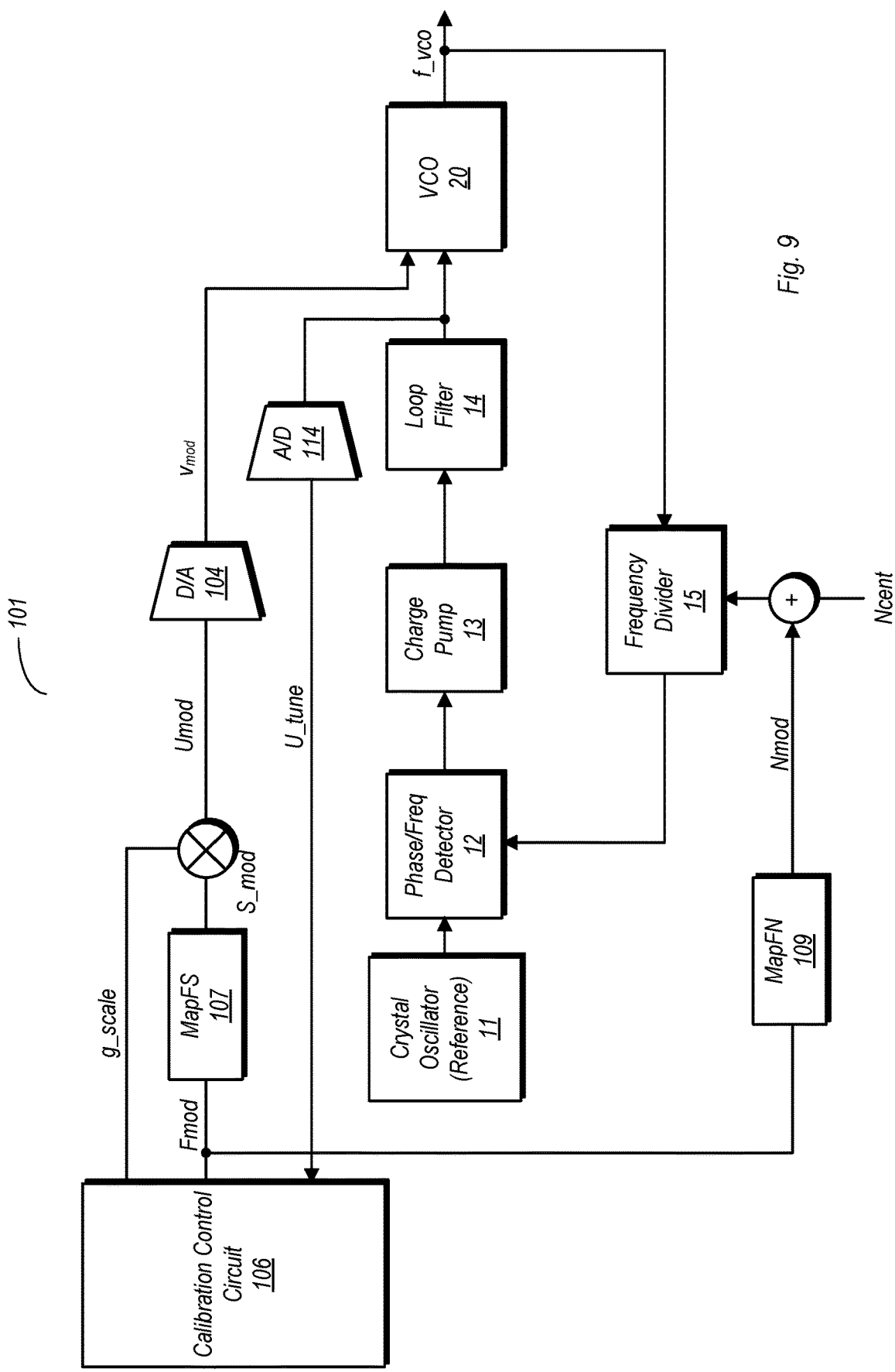
FIG. 9 is a block diagram of another embodiment of a PLL incorporating an embodiment of a VCO and a calibration circuit in accordance with this disclosure.
Figure 10:
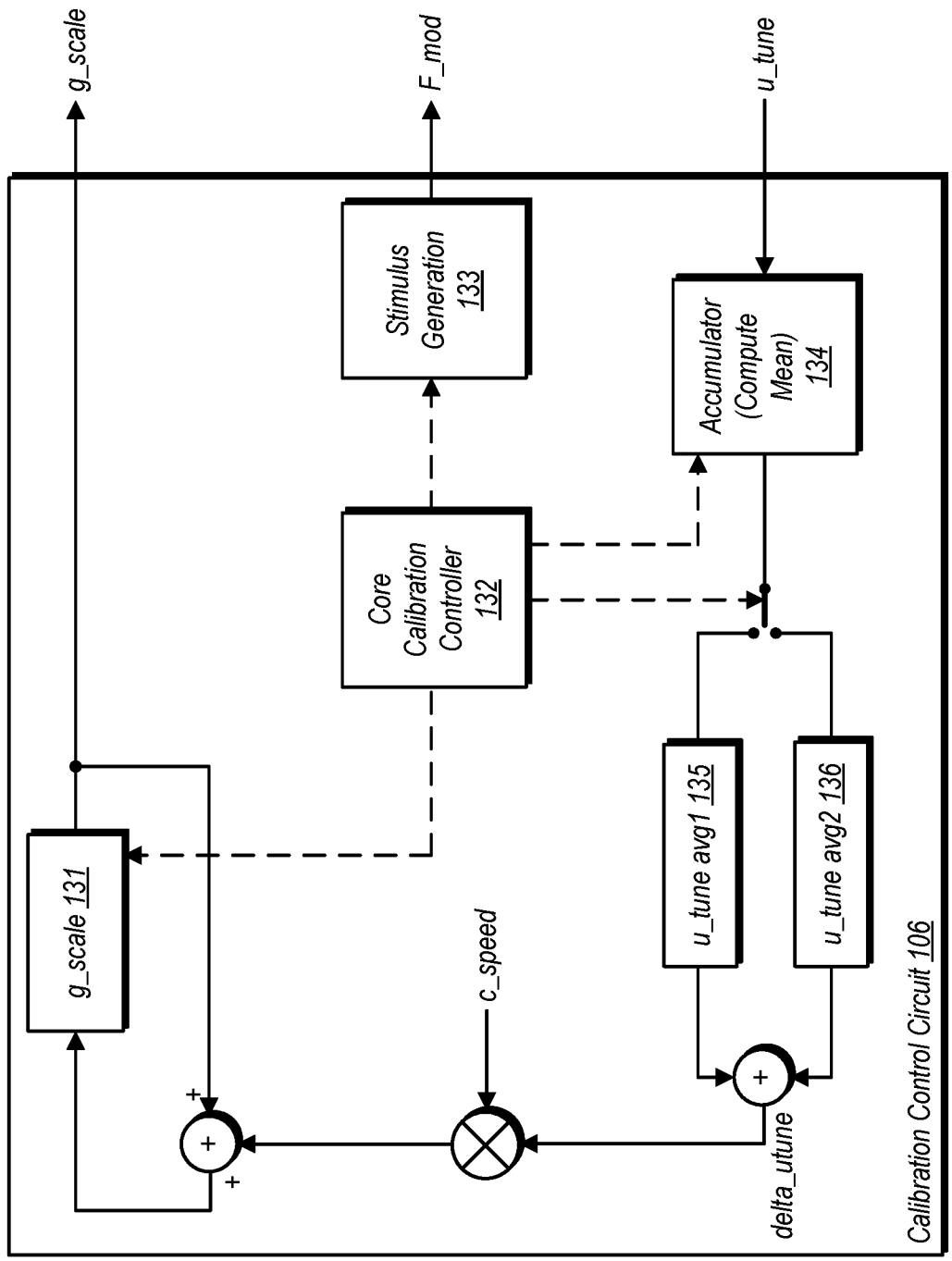
FIG. 10 is a block diagram of one embodiment of a calibration control circuit.

FIG. 9 is a block diagram of a PLL and a calibration system suitable for carrying out the disclosed methodology. In the embodiment shown, system 101 includes a calibration control circuit 106 which is configured to control the performance of the calibration methodology. A more detailed embodiment of calibration control circuit 106 is shown in FIG. 10.

Calibration control circuit 106 is configured to drive target frequency shifts (digitally represented as F_mod) to the two TPM injection points. The digital value F_mod may be any desired digital representation of a corresponding physical frequency shift $f_{mod}$. At the bottom of the PLL loop, F_mod is equivalently mapped (via a fixed scaling operation) by mapFN circuit 109 to the divider ratio modulation signal $N_{mod}$ where it added to the channel center divide ratio $N_{cent}$. MapFN circuit 109 may capture different numerical representations an implementer may choose to initially represent the frequency shift $f_{mod}$ as quantity F_mod and right after as a corresponding representation as a divide ratio $N_{mod}$. In one embodiment, the function mapFN implemented by mapFN circuit 109 may mathematically be a fixed scaling (e.g., bit-shift/bit-mapping) operation.

As noted above, any division by fractional N in feedback divider may be understood to be implemented using, e.g., an SDM as a first step inside frequency divider 15.

The same abstract digital frequency shift quantity F_mod is remapped via mapFS circuit 107 to a digital representation u_mod suitable for the direct VCO modulation path of the TPM. The output of mapFS circuit 107 in the embodiment shown is a fixed implementation-dependent rescaling (numerical re-mapping) operation an implementer may choose to map an initial digital representation F_mod of $f_{mod}$ to a related quantity s_mod that can serve as a drive signal for a digital-to-analog converter (DAC) 104 converter to generate the varactor modulation voltage $v_{mod}$.

Calibration control circuit 106 may also output a scaling value, g_scale. In one embodiment, under the preliminary assumption of g_scale being 1.0, the mapping provided by mapFS circuit 107 may be chosen such that using the mapped output u_mod directly as input s_mod to the $v_{mod}$. DAC 104 may generate a voltage $v_{mod}$ that accurately reflects the "nominal" the modulation path VCO gain in $k_{v,mod}$, e.g., the VCO gain of a semiconductor part at room temperature and at a given desired channel center frequency. That is, if the loop and VCO were operated under such idealized conditions, the system would be in a balanced state with no further intervention. In practice, however, $k_{v,mod}$ will not be precisely known a priori, as it may from one physical device to another, over temperature or supply voltage, and as a function of the channel frequency. Therefore, an adjustable scaling step with a scaling constant g_scale may be used to adaptively rescale s_mod to the final digital representation u_mod of the desired VCO frequency shift, which after D/A conversion from u_mod to $v_{mod}$ is applied to the VCO's secondary varactor in the form of the analog modulation voltage $v_{mod}$.

If the true $k_{v,mod}$ is smaller than the nominally expected $k_{v,mod}$ (e.g., owing to device physics, temperature, or channel center operating point) and no compensation is accomplished, a situation like the one leading to the illustration graph (b) of FIG. 8 will be present. To avoid such an imbalanced scenario, g_scale may be chosen to be greater than unity (1.0) such that a larger $v_{mod}$ is generated for a given desired $f_{mod}$ or its digital equivalent, and if g_scale is picked correctly, the balanced situation leading to FIG. 7 may be achieved.

If, on the other hand, the true $k_{v,mod}$ is larger than the nominally expected $k_{v,mod}$, and no compensation is used, a situation like the steady-state operation in graph (a) of FIG. 8 may be found. In this case, a g_scale value of less than 1.0 may accomplish a suitable compensation and restore a balanced system configuration as the one illustrated for steady-state in FIG. 7.

Thus, the calibration methodology disclosed herein may be used to find a suitable scale factor g_scale. A suitable scaling factor g_scale may therefore be a suitable digital compensation factor proportional to the ratio $k_{v,mod,nominal}/k_{v,mod,true}$.

A more detailed embodiment of calibration control circuit 106 is shown in FIG. 10. As previously noted, the goal of the calibration circuit shown in FIG. 9 is to determine the required relative scaling between signal u_mod driving the modulation varactor input of the VCO 20 and the change N_mod of the divisor feeding into the divider circuit of the PLL, to accomplish a well-controlled frequency shift F_mod of the PLL-stabilized VCO 20. Note again that N_mod and F_mod are mathematical equivalents of each other, as the division is based on counting clock edges and control of N_mod is therefore very deterministic. In the embodiment of the calibration control circuit 106 shown in FIG. 10, the relative scaling g_scale 131 between u_mod and F_mod (or, effectively N_mod and u_mod), is incrementally updated as per iterations of measurements of the A/D converted tuning voltage u_tune of the VCO. Specifically, a desired test value of F_mod is provided by the stimulus generation 133. An initial value (or guess) of g_scale is provided by g_scale module 133 to the circuit 101 outside of the calibration control circuit 106. For the chosen F_mod and g_scale, after PLL settling, the tuning voltage u_tune is recorded and averaged over a certain interval by Accumulator (Mean Computation) module 134. The result is recorded as u_tune_avg1 135. Then a second measurement is carried out for a different stimulus F_mod, and again after PLL settling, the new average tuning voltage is calculated as u_tune_avg2 136. In one beneficial embodiment, F_mod in the first measurement will be zero and it will be non-zero in the second measurement. All of these steps (select stimulus, initiate recording of tuning voltage etc.) inside of 106 are orchestrated by the Core Calibrated Controller 132. After u_tune_avg1 and u_tune_avg2 have been measured and stored off, their difference (delta) is calculated through subtraction, and this delta is used to update g_scale 131. A configurable (but fixed) scale factor c_speed is utilized to scale the tuning voltage delta before it is fed into the update of g_scale. This scale factor controls the convergence speed for the g_scale adaptation. The larger g_scale, the faster g_scale is moved in the desired direction that will incrementally make delta go to zero is the two measurements are repeated.

Figure 11:
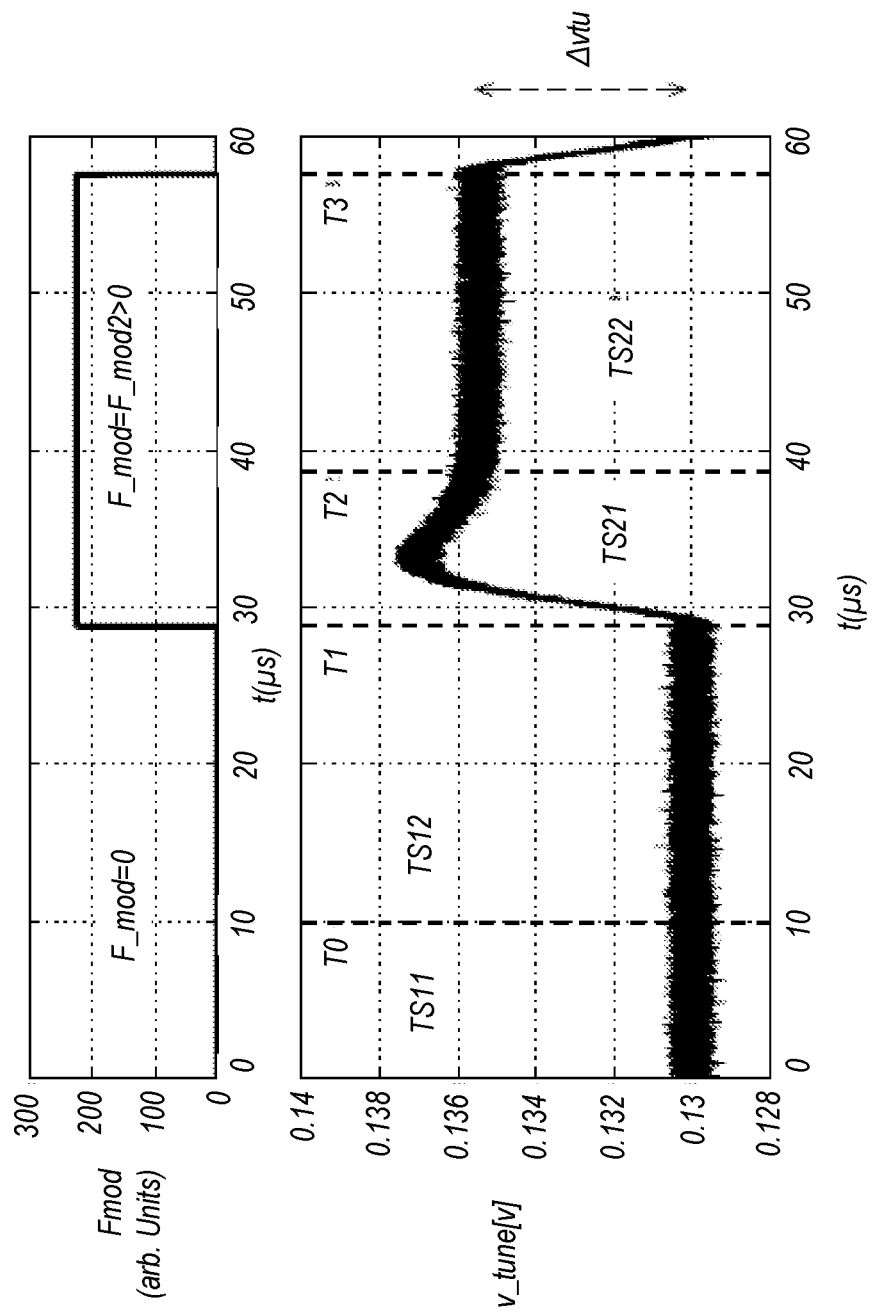
FIG. 11 is diagram illustrating operation of one embodiment of a VCO based on two-point modulation (TPM).

FIG. 11 illustrates a measurement scenario consisting of two time segments for one embodiment of a PLL as disclosed herein. Time segment TS1 is from t=0 (i.e. time=0 seconds) to t=T1=28.8 us, and TS2 is from t=T1=28.8 us to t=T3=57.6 us. Furthermore, TS1 is subdivided into the time sub-segment TS11 from t=0 to t=T0=9.6 us and TS12 from t=T0 to t=T1; and TS2 is subdivided from into TS21 from t=T1 to T2 and TS22 from T2 to T3. The Figure illustrates how the system according to FIG. 9 is stimulated (FIG. 11, top) and how it responds to the stimulus (FIG. 11, bottom).

During TS1, a zero-valued modulation frequency (F_mod=0) is injected to the TPM. In this example, it is assumed that even before TS1, F_mod has been zero For some time, so the TPM/PLL is already in steady-state in the channel center. The bottom signal shows the steady-state tuning voltage for this operating point, which is roughly 0.13 V in addition to random noise for this particular example.

In segment TS2, calibration control circuit 106 changes the digital representation of the modulation frequency F_mod to a non-zero value, F_mod=F_mod2, to represent a certain desired frequency shift away from the channel center, e.g., MHz. $N_{mod}$ is kept at that constant value throughout TS2. Note that according to the system illustrated in FIG. 9, F_mod is mapped in mapFN circuit 109 to a corresponding shift $N_{mod}$ in the divide ratio N relative to the divide ratio $N_{cent}$ in the channel center, in order to accomplish this desired frequency shift of 1 MHz. As explained earlier, by implementing the divider in digital logic, computing the desired shift $N_{mod}$ based on F_mod may be accomplished with a very high degree of reliability and numerical accuracy.

Generating the signal u_mod from the non-zero F_mod value, i.e. the digital representation of the varactor modulation voltage ( )*, to accomplish the desired frequency shift of 1 MHz is trickier. It is assumed that the (optional, fixed) mapping step mapFU, the subsequent (programmable) scaling step by g_scale, and D/A conversion from u_mod to $v_{mod}$, produce a signal $v_{mod}$ that is slightly smaller than that required to shift the VCO by 1 MHz. To use the nomenclature introduced in FIGS. 7 and 8, $v_{mod}$ is configured to take value $v_{mod}=v_{m,3}$ as in FIG. 8, graph (b), instead of the slightly larger value $v_{mod}=v_{m,1}$ as per the balanced scenario shown in FIG. 7. This slightly un-balanced scenario causes the tuning voltage to shift from $v_{t,1}$ to $v_{t,3}$ in FIG. 8, graph (b), as opposed to staying at $v_{t,1}$ as in FIG. 7.

This shift in the tuning voltage after injection of non-zero F_mod is represented in the bottom part of FIG. 10 as a new steady-state voltage for $v_{tune}$ of 0.1355V, in sub-segment TS22. Note though that the TPM/PLL takes some time to react to the imbalanced stimulus before it settles into its new steady-state operation. This is illustrated by means of the loop response in TS21, that is, the temporary overshoot and subsequent settling to the new steady-state voltage, which is reached at roughly t=T2.

In this invention, accurately measuring the steady-state tuning voltages $v_{tune}$ will be accomplished by the ADC converting $v_{tune}$ to a digital, discrete-time representation u_tune (see FIG. 9); then accumulating u_tune samples and dividing by the number of samples, over intervals TS12 and TS22, respectively, will yield the digitally represented desired average (or mean) values of $v_{tune}$, u_tune_avg1 and u_tune_av2. This approach averages out any noise contributions and, by choice of the intervals, skips any PLL transients as that shown in TS21. Note that in the illustration of FIG. 10, there is no transient in TS11, as the TPM/PLL is assumed to have been in steady-state for a while; in a more general case, however, there may be other activity before t=0, including steps to power up the circuit, so having a first skip/settle interval TS11 of a suitable length before the first measurement interval TS12 guards against any such settling effects.

The measurement of the digitally represented mean tuning voltage u_tune_avg1 obtained during interval TS12 will be referred to as the "Reference Measurement" (or First Measurement), while u_tune_avg2 from TS22 will be referred to as the "Offset Measurement" (or Second Measurement) in what follows.

The extent to which the average value of $v_{tune}$ during TS22 differs from the average value of $v_{tune}$ during TS12, labeled as $\Delta v_{tune}$ in FIG. 8, graphs (a) and (b), and illustrated by means of the positive value $\Delta v_{tune3}$ in FIG. 8 graph (b), is a measure for the mis-adjustment of $v_{mod}$ in relation to the desired frequency shift represented by F_mod. The invention makes use of the measured $\Delta v_{tune}$ between the two steady-state measurement intervals to adjust $v_{mod}$ and, gradually, bring the system back into balance. In one embodiment, this is accomplished by adjusting the scale factor g_scale by a term that is a function of this tuning voltage difference. Specifically, in one embodiment, g_scale is adjusted as follows:

$$g\_scale[n+1]=g\_scale[n]+c\_speed*delta\_utune \quad [Eq. 14]$$

where n is the iteration index in a series of adjustments (or series of measurements), c_speed is a constant scale factor, typically small, that can be used to determine the convergence behavior (or "step size") of the adaptive algorithm. Furthermore, delta_utune is a digital representation of $\Delta v_{tune}$, obtained from averaging u_tune for the two measurements as described above. That is, delta_utune is essentially the subtraction (u_tune_avg2−u_tune_avg1). In the example of FIG. 8, graph (b) and 10, the effective varactor drive voltage $v_{mod}$ during measurement period TS22 was chosen too small, causing a positive-valued delta_utune; by increasing g_scale by some positive amount according to Eq. (14) for subsequent measurements, the digital equivalent u_mod of υ( )* is raised for the given F_mod, so that a subsequent measurement for the non-zero value of F_mod will create a steady-state scenario that is somewhere between those shown in FIG. 8, graph (a) and FIG. 7. FIG. 9 illustrated the detailed structure inside one embodiment of the calibration control circuit 106, with sub-blocks implementing the measurements (averages of the A/D converted tuning voltage u_tune), computation of delta_utune, and recursive update of g_scale.

Once a suitable and accurate g_scale has been determined based on this adaptive approach, and under the simplifying assumption of the varactor/VCO model following the linear description of Eq. (8), this scale factor g_scale will be suitable for any desired frequency shift F_mod. The value g_scale will then be a suitable digital representation of, effectively, $1/k_{v,mod}$ per Eq. (13), such that the term $k_{v,mod} \cdot v_{mod}(t)$ per Eq. (8) will equate to $f_{mod}=N_{mod}f_{xo}$, no matter what the desired frequency shift value $f_{mod}$ is. Therefore, g_scale may, implicitly, be a suitable representation of the sought-after $k_{v,mod}$ or, to be precise, an inverse correction term for it allowing to precisely drive the VCO with the desired voltage that induces the targeted frequency shift. Using this g_scale for any desired modulation waveform with its instantaneous frequency component $f_{mod}$ will, therefore, keep the TPM/PLL in balance, so that a high-fidelity, high-performing system configuration has been reached.

Note that the adaption step size c_speed may be chosen to trade adaptation speed against adaptation noise. The larger c_speed, the faster the convergence, but a too-large choice can make the adaptation unstable, so a small value of c_speed is often preferred.

Below, various beneficial variations and embodiments of this basic calibration method are presented. Moreover, some practical constraints such as varactor non-linearity are highlighted and addressed with further novel approaches in subsequent sections of this disclosure.

Data Path Operation, Post Calibration:

In preceding discussion, the focus has been on finding a suitable g_scale via a procedure that involves a series of Reference and Offset measurements of the tuning voltage. Those steps represent the VCO Gain Calibration.

Once g_scale is known for a desired device and system configuration, the calibration result (g_scale) can be utilized during regular data path operation of the wireless circuit. That is, g_scale can be used when the polar/TPM transmitter represents the $f_{mod}(t)$ portion of signal s(t) per Eq. (4) of packet transmissions being sent out on the antenna. This is the "compensation" part, that is, the adjustment of the system parameters to compensate for previously unknown, but now known (or implicitly known) $k_{v,mod}$ when utilizing the wireless transmitter device for its purpose of sending wireless data packets.

Figure 12:
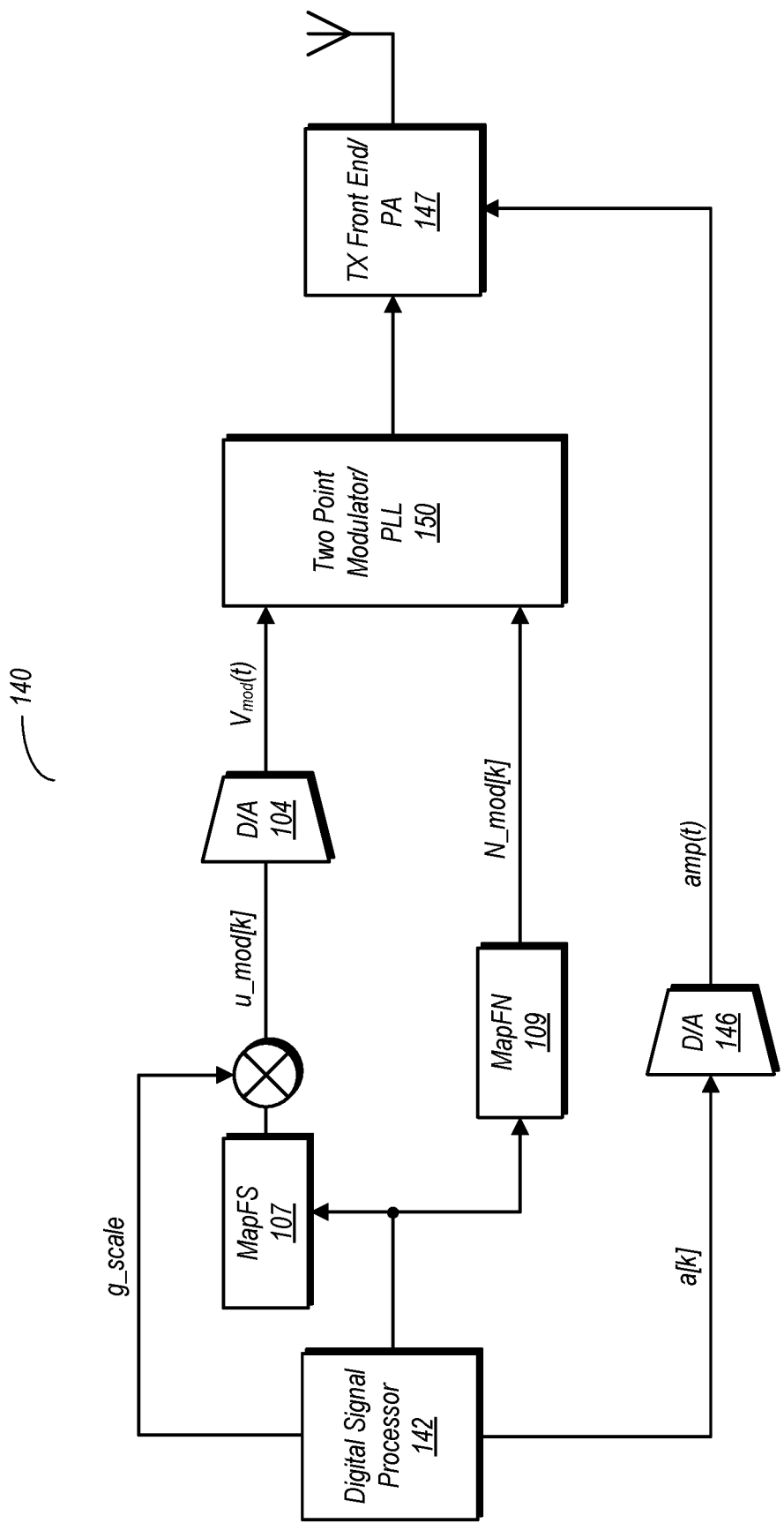
FIG. 12 is a block diagram illustrating an embodiment of a data path for a transmitter utilizing an embodiment of a TPM-PLL.

Such data path operation with previously determined g_scale is illustrated in the overview schematic of FIG. 12, which is a block diagram illustrating an embodiment of a data path for a transmitter utilizing an embodiment of a TPM-PLL. In the embodiment shown, data path 140 illustrates how discrete-time, digital signals representing the amplitude a[k] and instantaneous modulation frequency F_mod[k] of the polar signal defined in Eq. (4) and (6) are provided by a digital signal processing circuit 142. The value k is the discrete-time time index (or sample index). The digital value a[k] in the embodiment shown is converted, by DAC 146, into an analog signal amp(t). As during the calibrations, discrete-time digital signals are mapped into their analog counter-parts (such as $v_{mod}(t)$) and fed into the TPM PLL 150 and, for the amplitude, the transmitter front end/power amplifier 147. Again, g_scale is assumed to be fixed during the transmission of a given wireless packet, and assumed to contain the latest or best known value best representing the current VCO gain.

Note that the tuning voltage $v_{tune}$, while active to stabilize the PLL during Data Path Operation, will not be A/D converted and used for computations while the system is in Compensation mode (as opposed to Calibration mode).

Measurement Scheduling and g_scale Updates:

There are a variety of beneficial embodiments in specific temporal arrangements (that is, scheduling) of $v_{tune}$ measurements (Reference and Offset Measurements) and updating g_scale based on the results, as now discussed herein.

Conceptually, it may be sufficient to measure the average $v_{tune}$ only once for zero-valued frequency shift (F_mod=0), then adjust F_mod to the non-zero value and repeatedly measure the steady-state $v_{tune}$, where each such measurement is followed by an update of g_scale, a settling/guard period to accommodate any transients, and another measurement, and so on. In the nomenclature introduced for FIG. 11, a measurement TS1 with F_mod=0 would be followed by a series of measurements TS2 with non-zero F_mod, computing a delta_utune for each of those TS2 measurements relative to the original TS1 measurement, and updating g_scale after each measurement TS2 in that series of TS2 measurements.

In practice, and in one preferred embodiment of this invention, it is beneficial to take measurements by means of alternating injections of F_mod=0 and F_mod=non-zero. That way, if there are any slow drifts in $v_{tune}$ that are unrelated to the system balancing objective in question, as may occur in practice especially during time periods when powering up of the analog circuits or locking of the PLL has happened fairly recently, they will cancel out in the subtraction generating delta_utune.

The approach of alternating F_mod=0 and F_mod>0 (or F_mod<0) can also be exploited by using a "sandwich" approach to obtain the average measurements u_tune_avg1 and u_tune_avg2. Specifically, u_tune_avg1 can be obtained not in a single measurement, but by performing two measurements F_mod=0 that take place both before as well as after the measurement determining u_tune_avg2, and combining (averaging) the outcomes. That way, if any long term drifts of the PLL take place, the new averaged u_tune_avg1 approximates the conditions of $v_{tune}$ that would have been present if the Reference Measurement F_mod=0 had been conducted at the same time as the Offset Measurement.

In a real-life system, when a large number of circuits is manufactured, the VCO gain ($k_{v,mod}$ in the context of the present calibration) may differ substantially part-to-part, so that at first-time use of a given circuit the required g_scale may have to be chosen from a wide range of values. Meanwhile, the drift of $k_{v,mod}$ over time in an active device (due to operating temperature, power supply variation, or device aging) may be relatively slow. This observation suggests the following approach:

1) At manufacturing time, during an Initial Manufacturing Calibration, g_scale is measured by a rapid series of Reference/Offset measurement pairs to incrementally update g_scale until a balanced PLL is achieved. The resulting g_scale is stored off in a non-volatile memory on the device so that "in the field" (utilization of the device for actual wireless transmissions once out of manufacturing), this value can be picked up as a starting point when the device is powered up from a Reset state.

2) From then on, in tracking calibrations, that is during a series of packet transmissions or at regular intervals with the device in the field, g_scale is updated with a small step size c_speed to carefully track small changes.

For #1 above, initial manufacturing calibration, it may be beneficial in the rapid series of reference/offset measurements to start out with a large c_speed for fast initial convergence to g_scale values close to the desired range, and then transition to a smaller c_speed for refinement.

For #2 above, tracking calibrations in a packetized transmissions system such as Bluetooth, it may be beneficial to update g_scale once (or with a small number of iterations such as twice or 3×) per wireless packet, as the RF/radio circuitry has to be powered up once per such a packet event, so the calibration can "piggyback" on the regular transmission. Such a Tracking Calibration event can take place right before or right after the regular wireless packet transmission. $K_{vco}$ Calibration Avoiding Measurement Singularity ("4-Point Calibration"):

The calibration methodology discussed above may benefit from refinements and additional processing steps in the context of real-life circuit effects such as VCO varactor non-linearity, limited resolution of ADCs and DACs involved in the signal generation, and in particular, a general "singularity" dilemma when measuring small signals in the presence of noise.

Figure 13:
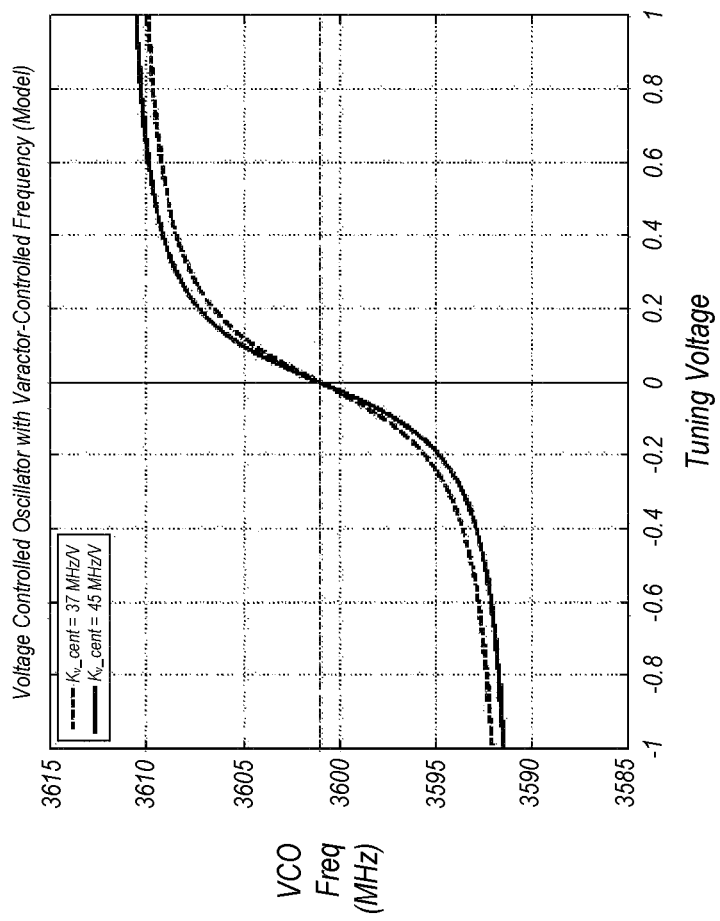
FIG. 13 is diagram illustrating a tuning voltage-to-oscillation frequency characteristic for one embodiment of a VCO in accordance with this disclosure.

FIG. 13 graphically illustrates models of two hypothetical VCO varactors for two slightly different device characteristics. Both varactors exhibit the same general behavior: a linear dependency between input voltage and frequency shift for small input voltages, and increasing compression for larger input values. The varactor gains $k_{v,mod}$ in the center of the characteristic represent slopes of 37 MHz/V and 45 MHz/V, respectively. The maximum frequency deviation for +/−1 V input voltage is in the order of +/−10 MHz, and the slopes of the characteristic drops considerably as the input voltage exceeds +/−100 mV. As a function of the radio design specification at hand, and depending on the Integrated Circuit technology utilized, practical varactors may differ substantially in the specific shape of the characteristic including VCO gain in the center and range of linear behavior before compression; however, most practical varactors will exhibit this tendency of gradual compression towards larger input voltages.

To represent signals through direction modulation of the RF oscillator as in TPM, the varactor should have sufficient range to cover all instantaneous modulation frequencies $f_{mod}$ as required for the desired waveform. Moreover, in contrast to the simplified linear model in the previous section, to compensate for the compression of the VCO gain requires, in general, a mapping from F_mod to $v_{mod}$ that contains operating-point dependent scaling g_scale. That is, a larger frequency deviation F_mod from the channel center will require a larger mapping factor g_scale than a smaller frequency deviation. For instance, an input voltage $v_{mod}$ of 100 mV induces a frequency shift of close to 0.45 MHz for the 45 MHz/V varactor, i.e., an offset close to the frequency shift under the assumption of the nominal $k_{v,mod}$ in the center. However, if twice that voltage is applied (200 mV), the frequency shift is only 6.5 MHz instead of the nominal 0.2 V*45 MHz/V=9 MHz, and to induce an actual frequency shift of 9 MHz, a much larger input voltage of roughly 0.6 V is required.

The use of differing g_scale values as a function of the operating point, i.e., mapping from the desired F_mod to the varactor voltage $v_{mod}$, may depend on the statistics of the signal s(t) to be represented in relation to the compression characteristic of the varactor utilized. If the vast majority of desired frequency shifts F_mod that result from representing s(t) as an amplitude A(t) and instantaneous frequency shift $f_{mod}(t)$ are centered around 0 Hz and stay within the center region of the characteristic where the varactor is substantially linear, use of an F_mod dependent g_scale may not be necessary. Instead, a single g_scale representing the linear slope $k_{v,mod}$ in the center of the VCO characteristic will be sufficient.

Such favorable statistics may be found for Frequency Shift Keying (FSK) or Continuous Phase modulation (CPM) signals with a small modulation index where the frequency deviation is a relatively small fraction of the symbol baud-rate. Bluetooth's Gaussian Frequency Shift Keying (GFSK) mode is an example for a modulation whose baud-rate (symbol rate) is 1 MHz but its frequency deviation is typically less than 200 kHz in some of it variants, and in variants such as Bluetooth Low Energy (BLE), these deviations may be closer to 250 kHz. Another example are modulation formats that have a limited Peak-to-Average Power ratio (PAPR) and provisions to prevent crossings of the amplitude through zero. Bluetooth's 2 Mb/s PI/4-rotated Differential Quadrature Phase Shift Keying (pi/4-DQPSK) mode, which inherently prevents zero crossing and therefore fast phase transitions and spikes in the instantaneous frequency, is an example of such a signaling format.

For these kinds of waveforms, to achieve good signal purity in terms of, e.g., Error vector Magnitude (EVM), Spectral Mask, or general modulation accuracy, it is of significance, and often sufficient, to ensure that the slope $k_{v,mod}$ of the modulation varactor characteristic is known and compensated for, specifically for the linear center region of the varactor characteristic. For the transmit architecture of FIG. 12 (with TPM/PLL details shown in FIG. 9), it means that in regular Data Path Operation, the scale factor g_scale should be sized (calibrated) to a suitable value that corrects for $k_{v,mod}$ in the channel center, as discussed above.

To calibrate the system, notably the scale factor g_scale, for the VCO gain in the center of the varactor characteristic a value for F_mod may be used that is very close to the origin (i.e., close to F_mod=0) when doing the second measurement (Offset Measurement) in the computation of delta_utune. This would "sample" the system in the desired region of interest where $k_{v,mod}$ is essentially linear. There are, however, substantial limitations in practical systems that make it difficult to successfully exercise the system close to the origin of the varactor characteristic.

The first difficulty relates to the resolution of the DAC used to map from the digital representation u_mod of the modulation path varactor voltage to its analog representation $v_{mod}$. For example, assume that total number of D/A bits is 10 in 2's complement representation, so that the total range of inputs is −512 . . . +511. Limitation of D/A (or A/D) resolution may be common in systems that try to limit the power consumption in the system to maximize such parameters as battery life time. Further assume that the first calibration measurement utilizes F_mod=u_mod=0, while the second measurement uses a very small non-zero F_mod that maps into an u_mod of 20 (out of the max positive value of 511). It is further assumed that the delta_utune measurement indicates that g_scale should be updated by a small amount, such as 1%, to move the direction modulation path towards achieving a precisely adapted $v_{mod}$. Since u_mod, the digital equivalent of $v_{mod}$, is a function of g_scale, it, too, would have to be adjusted by 1%. However, 1% of 20 is 0.2, and u_mod can only be changed by whole units of 1, i.e., by one Least-Significant-Bit (LSB) of the DAC. The relative resolution in this example is 1/20, or 5%, in $v_{mod}$ cannot be made to reflect the 1% increase of g_scale. Therefore, an adjustment of $v_{mod}$ by a suitably small increment is impossible, and the delta_utune measurement, which reflects incremental adjustments of $v_{mod}$ and its effect on the balance of the TPM/PLL, is bound to fail when the objective is to adjust $v_{mod}$ to an accuracy of 1%.

The second, similar difficulty with running the "Offset Measurement" close to the origin (F_mod/$v_{mod}$ close to 0) is concerned with the resolution of the ADC converter for the tuning voltage of the primary varactor, $v_{tune}$. Assuming a structure where there is a similar resolution in Volts/LSB $v_{tune}$ as the $v_{mod}$ DAC converter, the $v_{tune}$ readings allowing calculation of the average $v_{tune}$ values for the two measurement intervals TS12 and TS22 and subsequent computation of delta_utune are subject to this ADC resolution. Averaging (as utilized during intervals TS12 and TS22 for the computation of delta_utune) may help, but the inherent limitation remains.

Thirdly, and of significant importance, the following artifact plays a crucial role: for a given small F_mod utilized for the "Offset Measurement" in the adaptation, the two $vt_{une}$ measurements will hardly differ and be masked by unavoidable thermal/system noise and other possible impairments in the PLL, requiring long measurement intervals TS12 and TS22 for averaging $v_{tune}$ samples. This amount of time for long averaging may not be available in a system that has to transmit and receive actual data packets on a continuing basis and with very little acceptable interruptions for calibration purposes. Therefore, the "Signal-to-Noise" conditions in the overall measurement delta_utune may degrade quickly as F_mod is chosen so that $v_{mod}$ is close to the origin of the varactor curve during the Offset Measurement, while the stimulus difference between F_mod=0 and F_mod≠0 is very small.

Overall, this "singularity" from measurement noise and A/D and D/A quantization effects, can easily lead to substantial miscalculations of the linear slope $k_{v,mod}$ that is derived (via the adaptive algorithm), in essence, to represent the ratio of the difference between the two F_mod ($v_{mod}$) values over the measured delta_utune.

Conversely, choosing a larger non-zero F_mod/u_mod for the second measurement of, say, 100 for the above 10-bit $v_{mod}$ DAC, will allow much more precise adaptation of g_scale and reflection of that adaptation in an incremented or decremented u_mod/$v_{mod}$. Similarly, this larger value for u_mod will induce a larger delta_utune between the two measurements for a given residual mis-adjustment of g_scale, resulting in a more precise read of the remaining imbalance and also allowing for shorter measurement intervals to average out noise. However, it is a practical reality that the slope of the varactor characteristic drops very quickly from the vco gain $k_{vco}$ in the center of the curve to forms of compression and smaller frequency shift in proportion to the input voltage already very close to the origin. Therefore, there exists an inherent dilemma in being able to measure the VCO gain close to the origin: on the one hand, using small values for F_mod of the second measurement exercises the system at the desired operating point, but may cause a (potentially critical) loss of precision in adjusting g_scale. On the other hand, using large values for F_mod of the second measurement allows great reliability in adjusting g_scale and taking the underling measurements for the adaptation, but this kind of measurement exercises the varactor at an operating point outside of the main region of interest right at the origin of the characteristic.

This dilemma is resolved in further, advanced embodiments of the invention, namely, by calibrating g_scale for several operating points away from the delicate origin and making use of the calibration results from those points to predict, or calculate, the desired value of g_scale in the origin by interpolation.

In one beneficial embodiment, pursuing this approach, the offset (second) measurement in a measurement pair per the calibration method as discussed above is carried out for four scenarios, one at a time, using F_mod=−2*B, −B, +B, +2B, where B corresponds to a frequency shift that is far enough from the origin to avoid said numerical issues; however, +/−B and certainly +/−2*B will therefore correspond to varactor voltages $v_{mod}$ that may very well introduce fine degrees of compression. The four values for F_mod, used during the second (offset) Measurement of each measurement pair, will be referred to as the four "Knots" K0, K1, K2, and K3, in what follows.

In what follows, this approach will be referred to as "4-Point" calibration. It is understood that a different number of points other than 4 may be beneficially used and that the knots can stimulate the TPM/PLL system at other values than +/−B, +/−2B, but the emphasis here will be on an approach where four offset measurements are utilized.

For instance, in a round-robin fashion, a Measurement Event is carried out that consists of the F_mod=0 Reference Measurement, followed by the Second (Offset) Measurement with F_mod being one of the four knots. Each knot has associated with it a separate g_scale factor representing the required factor to rescale the corresponding knot value F_mod so that, after adaptation, the resulting u_mod and $v_{mod}$ values induce the exact desired frequency shift to the VCO. Every forth Measurement Event uses the same knot for F_mod and updates one of the g_scale values, namely, the one associated with that knot. Starting from rough estimates for g_scale, after several iterations using all of the four knots, the g_scale values associated with all of the Knots will be the ones sought after to establish balanced conditions in the TPM/PLL for each of the four operating points.

Figure 14:
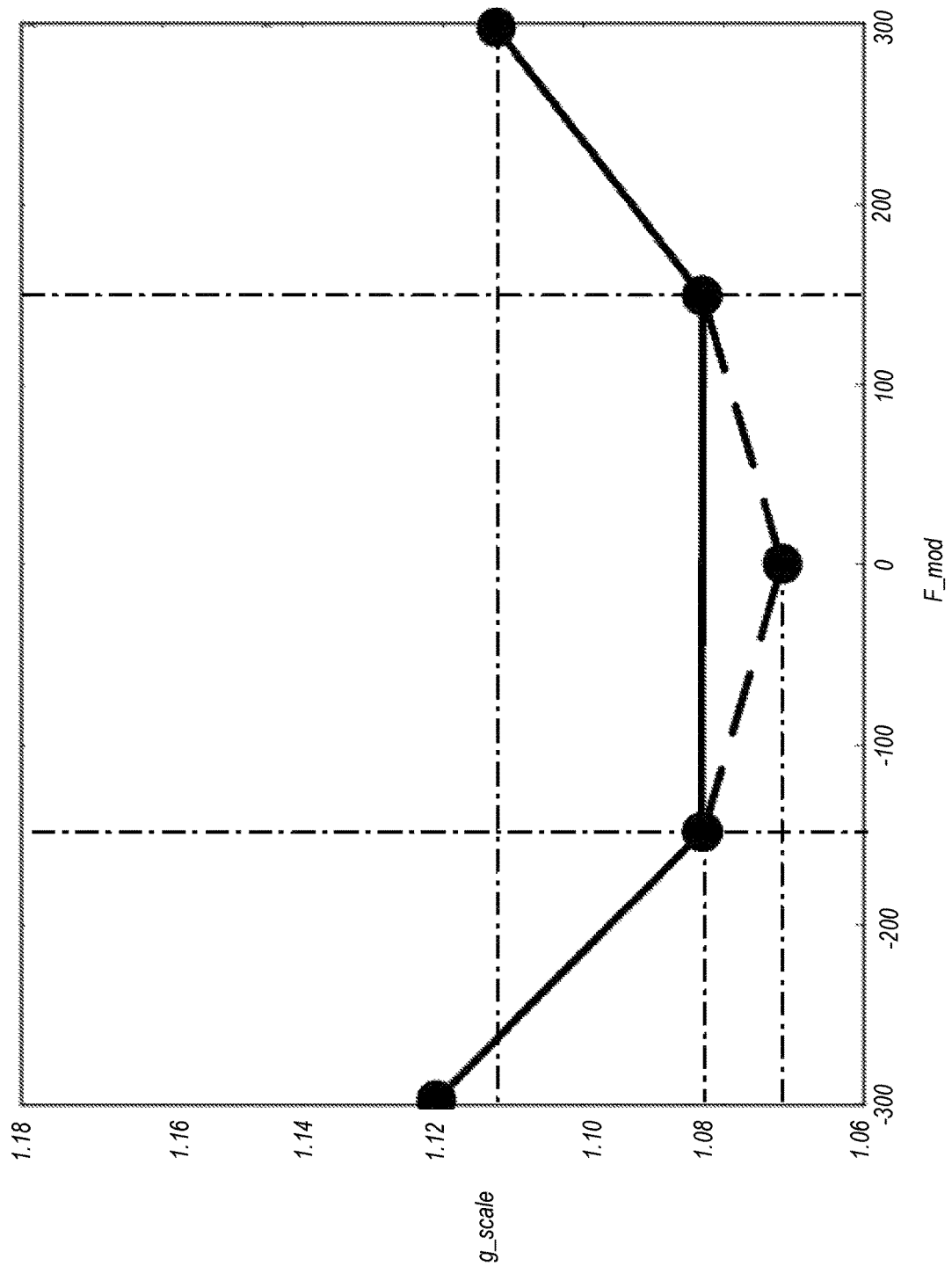
FIG. 14 is diagram illustrating g_scale factores vs. F_mod factors for one embodiment of a VCO in accordance with this disclosure.

FIG. 14 illustrates an example for the scale factors g_scale for 4 knots after convergence. The scale factors g_scale, which may be represented digitally using various numerical formats as a function of the desired implementation, and for one implementation with the four knots F_mod_i=−300, −150, +150, +300, were found to be roughly g_scale_i 1.12, 1.08, 1.08, and 1.11, for i=0,1,2,3, respectively. As expected, due to the compression of the frequency-vs-$v_{mod}$ dependency, larger values of F_mod required larger g_scale values to compensate the larger compression towards the outsides of the VCO characteristic.

The dashed lines, FIG. 14 also illustrate an interpolated value of g_scale for the center of the characteristic. In this example, the scale factor for the center turned out to be approximately 1.07. In one embodiment, the math utilized to estimate this value of 1.07 based on the g_scale results obtained for the 4 knots follows a simple third-order polynomial model approach written down for g_scale:

$$g\_scale(F\_mod)=p3*F\_mod^3+p2*F\_mod^2+p1*F\_mod+p0 \quad [Eq. 15]$$

where p0, p1, p2, and p3 are polynomial coefficients and were the superscripts $(\cdot)^{2,3}$ refer to the multiplicities (i.e., F_mod squared and F_mod cubed). The coefficients p0, p1, p2, and p3 are easily obtained by evaluating this equation for the four g_scale values g_scale_0,1,2,3, that have been found for each the four knots K0,1,2,3, respectively. To then obtain the desired scale factor for the origin of the varactor characteristic g_scale(F_mod=0), however, only p0 is needed, as g_scale(F_mod=0) readily evaluates to p0 and all other contributions cancel out. For the above introduced choice of the knots being −2*B, −B, +B, +2*B, using common means of linear algebra, it requires a small number of steps to calculate g_scale(F_mod=0) as:

$$g\_scale(F\_mod=0)=p0=1/6\{4*(g\_scale[1]+g\_scale[2])-(g\_scale[0]+g\_scale[3])\} \quad [Eq.16]$$

The equation reveals that the choice of B is not relevant in the computation of g_scale(F_mod=0) based on the g_scale results obtained for the four measurements. This is a consequence of the symmetric choice of the knots to use values F_mod=+/−2B, +/−B, so that B cancels out in the derivation of Eq. (16).

Note that the scale factor g_scale found by Eq. (16), representative of the linear part of the varactor curve, will then be used as the one and only g_scale applied during data path operation as outlined above (with reference to FIG. 12).

Despite this independence of Eq. (16) on the choice of B, there are better or worse choices for B in practice. The value of B can be chosen by an expert so that the inner knots are as close as possible to the origin while allowing for accurate adjustment of ( )* within the constraints of the $v_{mod}$ DAC and $v_{tune}$ ADC resolutions, while avoiding the "singularity" effect, and while choosing a "sampling" of the varactor curve in a way that lends itself for an accurate polynomial model. That way, the knots at +/−2B, +/−B will probe the nonlinear behavior of the VCO close to the origin without sacrificing resolution of test signals and measurements, thereby allowing reliable and accurate estimation of g_scale in the channel center.

It is noted again that choosing the knots as +/−2B, +/−B is arbitrary, and other choices to stimulate the system during the Measurements and to model the varactor based on a polynomial description, including different number of knots and different degrees of the polynomial model, will be obvious to the expert.

VCO Predistortion Calibration:

In the preceding discussion, the objective was to calibrate the system, by finding a suitable compensation scale factor g_scale, in the presence of finite VCO varactor non-linearity and by catering to the "singularity" effect close to the origin of the varactor characteristic due to A/D, D/A, and general signal-to-noise artifacts. The solution was to sample the varactor curve by means of four "knots" and, based on a polynomial model of g_scale versus desired frequency shift, derive the quantity of interest—namely, g_scale for the small frequency shifts in the linear region of the VCO's varactor. For this approach to be successful, an assumption is made about the frequency shifts (frequency modulation of the VCO over time, $f_{mod}(t)$ required to represent the waveform to be small. When frequency shifts are small, most of the activity stimulates the VCO in a region where a linear VCO gain $k_{v,mod}$ can be assumed, and a single scale factor g_scale is sufficient to put the varactor and fractional-N divider injection points to the TPM in perfect balance between each other.

There may be requirements, however, to represent signals whose modulation frequency $f_{mod}(t)$ exceeds the region of linearity to a degree and regularity that requires targeted intervention and an operating point dependent scaling of the signal feeding into the $v_{mod}$ varactor. Modulation schemes such as variants of 8-PSK utilized in Bluetooth may be affected by this as a function of the details of the VCO circuit implementation used. For such a scenario, VCO predistortion will help overcome signal distortion, and thus a suitable VCO predistortion methodology is introduced herein, building on the previous approach where measurements at four "knots" were used to sample the VCO varactor characteristic. Here, the same four measurements from the adaptive "4-Point" calibration approach discussed may be used to build a mapping function where at all times, i.e., as a function of the desired frequency shift F_mod, a specific g_scale value is provided to achieve use of a modulation voltage $v_{mod}$ that is commensurate for each desired frequency shift.

In the discussion of the 4-point calibration above, the four g_scale values are available from the 4-point methodology, g_scale_0,1,2,3, were used to come up with a polynomial model of g_scale as a function of F_mod, the only relevant parameter of which was the constant (zero order) coefficient, p0.

Here, a similar approach is used to derive and exploit a polynomial model not of g_scale, but of the varactor characteristic. Specifically, an output ($f_{mod}$)-to-input ($v_{mod}$) model lends itself to analysis. For a given desired frequency shift $f_{mod}$, it describes in polynomial terms the voltage $v_{mod}$ required to achieve the desired frequency operating point:

$$v_{mod}(f_{mod})=\Sigma_{k=0}^{4}P_k f_{mod}^{k} \quad [\text{Eq. 17a}]$$

where p0,1,2,3,4 are again polynomial coefficients. Note that the varactor curve goes through zero (no frequency shift for no applied voltage), so p0 can easily be found to be zero, and the model reduces to:

$$v_{mod}(f_{mod})=\Sigma_{k=1}^{4}P_k f_{mod}^{k} \quad [\text{Eq. 17b}].$$

Recalling that $f_{mod}$ is the analog equivalent of the digital signal F_mod and that the deterministic digital equivalent of $v_{mod}$ is u_mod (see FIG. 9), the polynomial model Eq. (17a) can be rewritten in terms of digital signal quantities, $$u\_mod(f_{mod})=\Sigma_{k=1}^{4}P_k(F\_mod)^k \quad [\text{Eq. 17c}],$$

where generally the values of the polynomial coefficients p0,1,2,3,4 in Eq. (17c) will be different (namely, some scaled version) of their counterparts in Eq. (17a).

If the model in Eq. (17c) can be fully instantiated by determination of the polynomial coefficients p1 ... p4, the required value of u_mod can be calculated as a function of the desired frequency shift F_mod for any value of F_mod within the physical constraints of the VCO. (Note that under the assumption of a fully linear model, that is for no compression characteristic, the higher order terms in Eq. (17c) are set to 0, and the remaining coefficient p1 is essentially identical to what was referred to as g_scale in previous sections.) This model, therefore, fulfills the goal set at the beginning of this section.

However, determination of the four coefficients are to be addressed, and the process to compute them is similar to that utilized for the 4-point approach discussed above. Equation (17b) has four unknowns, and they can be computed based on the four measurements outlined in the discussion of the 4-point calibration. Specifically, each of the four measurements is represented by an associated legitimate pair of u_mod and F_mod: For the i'th measurement (i=0,1,2,3), F_mod_i is the signal fed to the divider path (where it is mapped to $N_{mod}$), and u_mod_i is given by means of the four scale factor g_scale, as u_mod_i=g_scale_i*F_mod. (Note that the fixed implementation dependent numerical mapping mapFS is neglected here, and it will be obvious to the expert how to accommodate it if/where applicable.) Since these four pairs of (u_mod, F_mod) represent steady-state operating points of a balanced Two-point PLL with fixed $v_{tune}$, they describe valid points of the varactor characteristic which, using commonly known linear algebra techniques, can be utilized to solve the 4 instantiations of Eq. (17c) for the polynomial coefficients p1,2,3,4.

Figure 15:
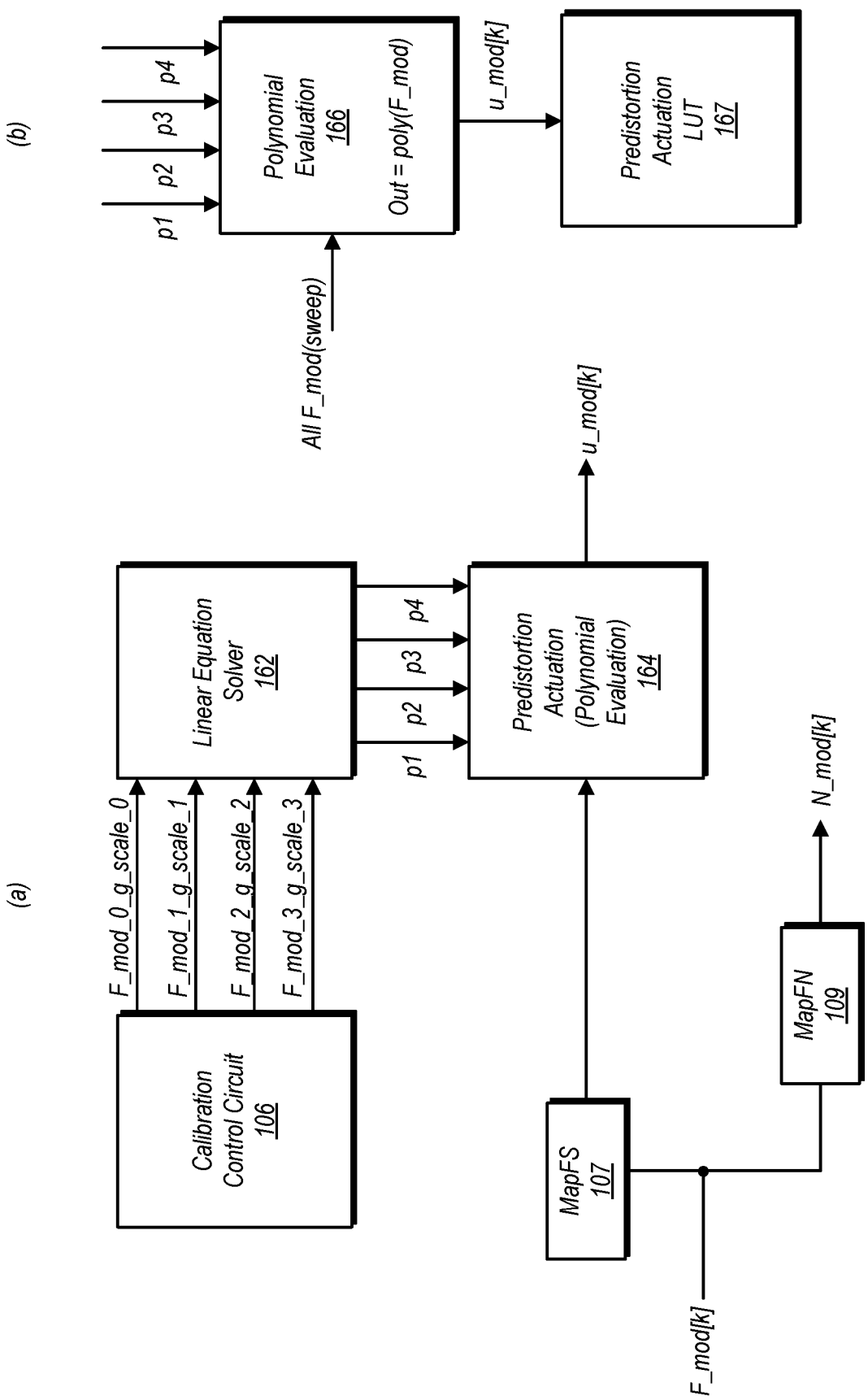
FIG. 15 is a pair of block diagrams illustrating calibration measurements being used to derive a configuration for one embodiment of a pre-distortion actuation module.

FIG. 15 illustrates the interaction between the modules required to turn the four balanced, steady-state pairs (u_mod, F_mod) obtained from the 4-point calibration into the four polynomial coefficients p1,2,3,4. The four polynomial coefficients may be generated by linear equation solver 162 based on the illustrated inputs provides from calibration control circuit 106. These four coefficients may be used during the data path operation for packet transmissions in the form of a predistortion actuation module 164 that evaluates Eq. (17b) for any given digital discrete-time F_mod[k] and for given polynomial coefficients, to produce digital sample u_mod[k]. The polynomial evaluation module 166 (which may be implemented within predistortion actuation module 164), therefore, plays the role of what used to be the scaler g_scale in the previous, linearized approach per FIG. 12. It is noted that the linear equation solver 162, predistortion actuation module 164, and polynomial evaluation module 166 may be implemented using hardware/circuitry, software, firmware, or any suitable combination thereof.

As noted above, mapFS circuit 107 and mapFN circuit 109 may perform deterministic reformatting steps an implementer may choose to achieve the desired numerical representation of the signals involved.

Note that there are alternative ways to implement the polynomial evaluation module 166. One avoids the real-time evaluation of Eq. (17c) and is based on a simple pre-populated look up Table (LUT), shown here as predistortion actuation LUT 167. Predistortion actuation LUT in the embodiment shown includes, for each possible input value F_mod, a suitable output value u_mod. The contents of the LUT is pre-computed the moment an updated polynomial model p1,2,3,4 is available from the calibration, by evaluating Eq. (17c) for all possible values of F_mod, before the LUT is used for wireless packet transmissions in Data Path Operation and thereby acting as Predistortion Actuation. This procedure is illustrated in FIG. 14b. There are other variants implementing predistortion pctuation that combine LUT approaches with real-time computations. For example, using linear interpolation between sparse set (subset) of data points for which Eq. 17c is pre-calculated to fill a smaller-size LUT.

The described approach for the 4-point calibration to obtain four valid "samples" of the varactor characteristic, namely, that of sending fixed values F_mod for each knot to the divider path while adapting g_scale in the path feeding into $v_{mod}$, is only one possible approach. There are other ways to obtain samples of the varactor characteristic by the use of the adaptive calibration described in this document. Below, one possible technique is outlined. This technique may lend itself better for a system where the carrier frequency changes in what is called frequency hopping (e.g., frequency hopping spread spectrum, or FHSS).

VCO Calibration in the Presence of Frequency Hopping:

Common wireless systems have a certain associated spectra available to their operation. For instance, the Bluetooth™ wireless system uses carrier frequencies in the ISM band between 2402 MHz and 2480 MHz, with a channel spacing of 1 MHz (or 2 MHz in certain more recent Bluetooth modes of operation). In a typical use case, the system will use a subset of these 79 channels and, with some regularity, adjust the "channel map" (selection of suitable channels) as a function of such parameters as interference conditions. Within the chosen channel map, the system will follow certain pre-defined "frequency hopping" patterns by transmitting a wireless packet in a given channel, then change the carrier frequency to the next channel in the frequency hopping sequence for the next packet, and so on. The hopping sequence is known to both devices connected in a given wireless link. A change of frequency may happen after about 1 ms, or after a small number of milliseconds depend on various protocol parameters such as packet types or packet lengths.

Figure 3:
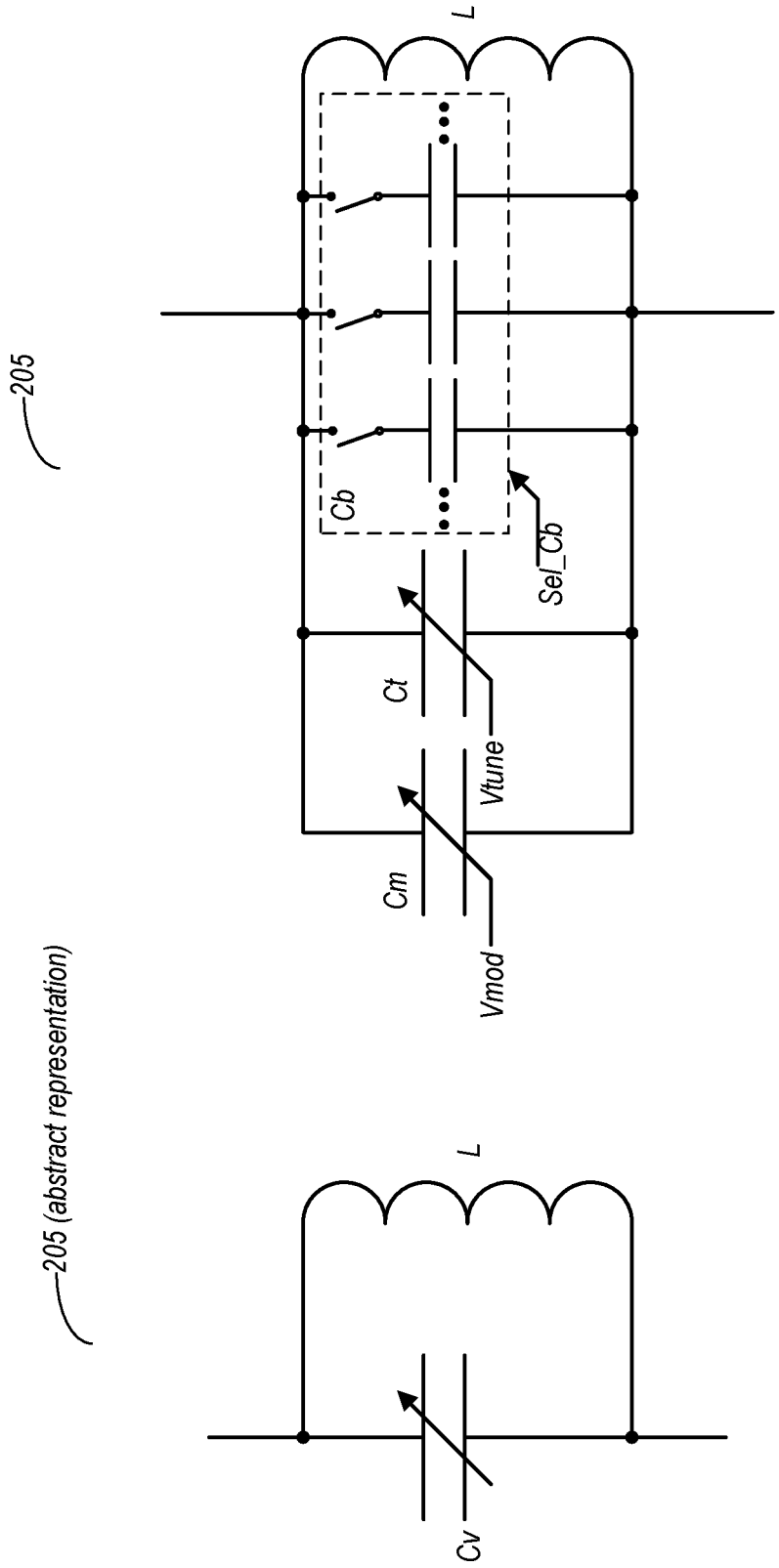
FIG. 3. is a diagram illustrating one embodiment of an inductive-capacitive (LC) tank circuit used in an embodiment of a VCO in accordance with this disclosure.

To tune the PLL of a system like the one shown in FIG. 2 or 5 to a specific channel, the divide ratio $N_{cent}$ and configuration of the VCO capacitor array Cb in FIG. 3 may be chosen to establish an oscillation close the desired oscillation frequency. The VCO's oscillation may be at a multiple such as 1.5×, 2×, 9×, or another multiple of the desired RF (antenna) carrier frequency, to avoid such real-life radio circuit artifacts as pulling between the PA output and, e.g., the LC tank of the VCO.

According to Eq. 7a, the VCO's oscillation frequency as a function of a tuning voltage v connected to its tuning port is given in general terms by:

$$fvco = 1[2\pi\sqrt{LC}] \quad \text{(Eq. 7a)}$$

where C(v) is the tunable capacitance that is composed of the big (programmable but per-packet fixed) bulk capacitance Cb and the contribution from the tuning varactor, as illustrated in FIG. 3. Using this nomenclature, the VCO gain $k_{vco}$ in the channel center (v=0) can be written as the following derivative of $f_{vco}$ with respect to v:

$$k_{vco} = \frac{d}{dv} f_{vco} \text{ for } v = 0.$$

After evaluating this derivative with the following steps, $$f_{vco} = 1[2\pi\sqrt{LC}] = k_{vco} = \frac{d}{dv} f_{vco} = \quad \text{[Eq. 18]}$$

$$\frac{1}{2}\frac{1}{2\pi}[LC(v)]^{-\frac{3}{2}} L \frac{d}{dv} C(v) = \ldots = 2L\pi^2 [f_{vco}]^3 \frac{d}{dv} C(v)$$

the result reveals that the VCO gain $k_{345}$ is a function of the VCO oscillation frequency $f_{vco}$. More precisely, in this common VCO model, $k_{vco}$ is proportional to the third power of the oscillation frequency. For instance, in a system operating in a frequency range 2400 to 2480 MHz, $k_{vco}$ in each respective channel center will differ by a factor of roughly $(2480/2400)^3 \sim 1.10$. Note that any possible clock divider inserted between the VCO and the antenna port will not change this math. Therefore, if the system performs switching of carrier frequencies in a hopping sequence, every hop (or new carrier frequency) will expose the system to a different $k_{vco}$ along with a corresponding varactor characteristic as far as the VCO's frequency modulation as a function of the input voltage v is concerned. Note that in real-life circuit designs, the cubic dependency predicted by the theory may only be an approximation. The implementation-dependent exponent may be close to 3 or assume another value between 2 and 3, or the VCO's behavior may be approximated by a different device-specific dependency according to which linear $k_{345}$ and the VCO characteristic are inherently scaled up as a function of the center frequency.

Figure 16:
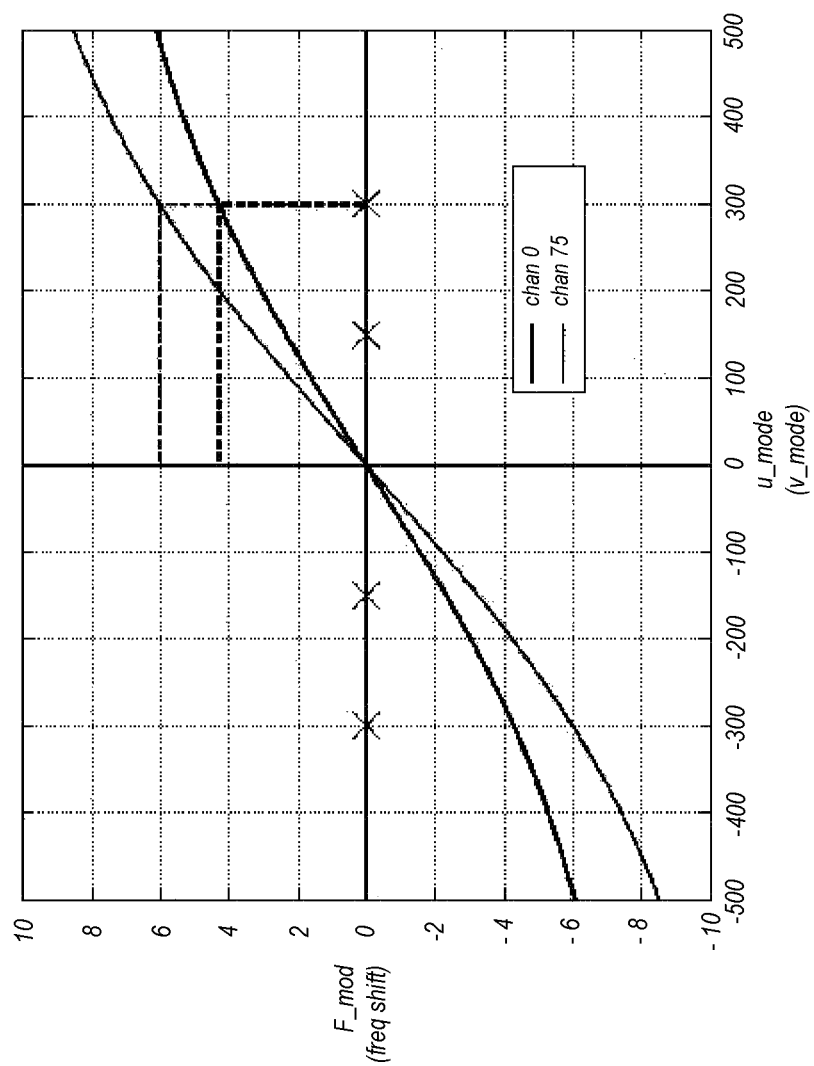
FIG. 16 is a diagram illustrating characteristics of one embodiment of a VCO, in accordance with this disclosure, for two different center carrier frequencies.

FIG. 16 illustrates a hypothetical varactor characteristic for a system operating at Bluetooth channel 0 (2402 MHz), and another one operating at channel 78 (2480 MHz). The two curves are scaled on the vertical axis (frequency shift dimension) with respect to one another, in-line with the observation that the linear slopes $k_{vco}$ in the center of the curves and, along with that, the overall curves are scaled versions of each other, following the VCO center frequency, as per Eq. (18). Note that in FIG. 15, the scale factor visible on the y-axis of the plot, which from the theory should be about 1.10 between ~2400 and ~2480, is exaggerated for ease of illustration.

Due to this frequency dependency of the VCO characteristic, if an adaptive algorithm like the one outlined in previous sections is utilized, the underlying $k_{vco}$ and the overall VCO characteristic will change with each hop, so each carrier frequency will require its own g_scale (or predistortion mapping). Otherwise, e.g., if there is only a single g_scale, the adaptation in Eq (14) will hunt constantly differing physical conditions upon each change of the center frequency, and g_scale will never accurately reflect the $k_{vco}$ condition of any of the channels.

In one solution, a separate g_scale (or set of four g_scale variables in the 4-point case) can be provided for each channel center frequency, so that whenever the system hops to a specific channel, only the corresponding g_scale (or set of four g_scale's) will be updated. This may come at substantial hardware effort to maintain instances of the various g_scale factors for each channel. In some instances, when the system decides to skip use of a certain channel over an extended type period due to unfavorable interference conditions, this channel may not benefit from g_scale updates for a long time. Once the system decides to give this channel another try at a much later time, conditions (such as temperature) may have drifted substantially and the g_scale factor(s) may be outdated and the quality of any outgoing transmissions may be degraded. Accordingly, another approach is introduced below.

Figure 17:
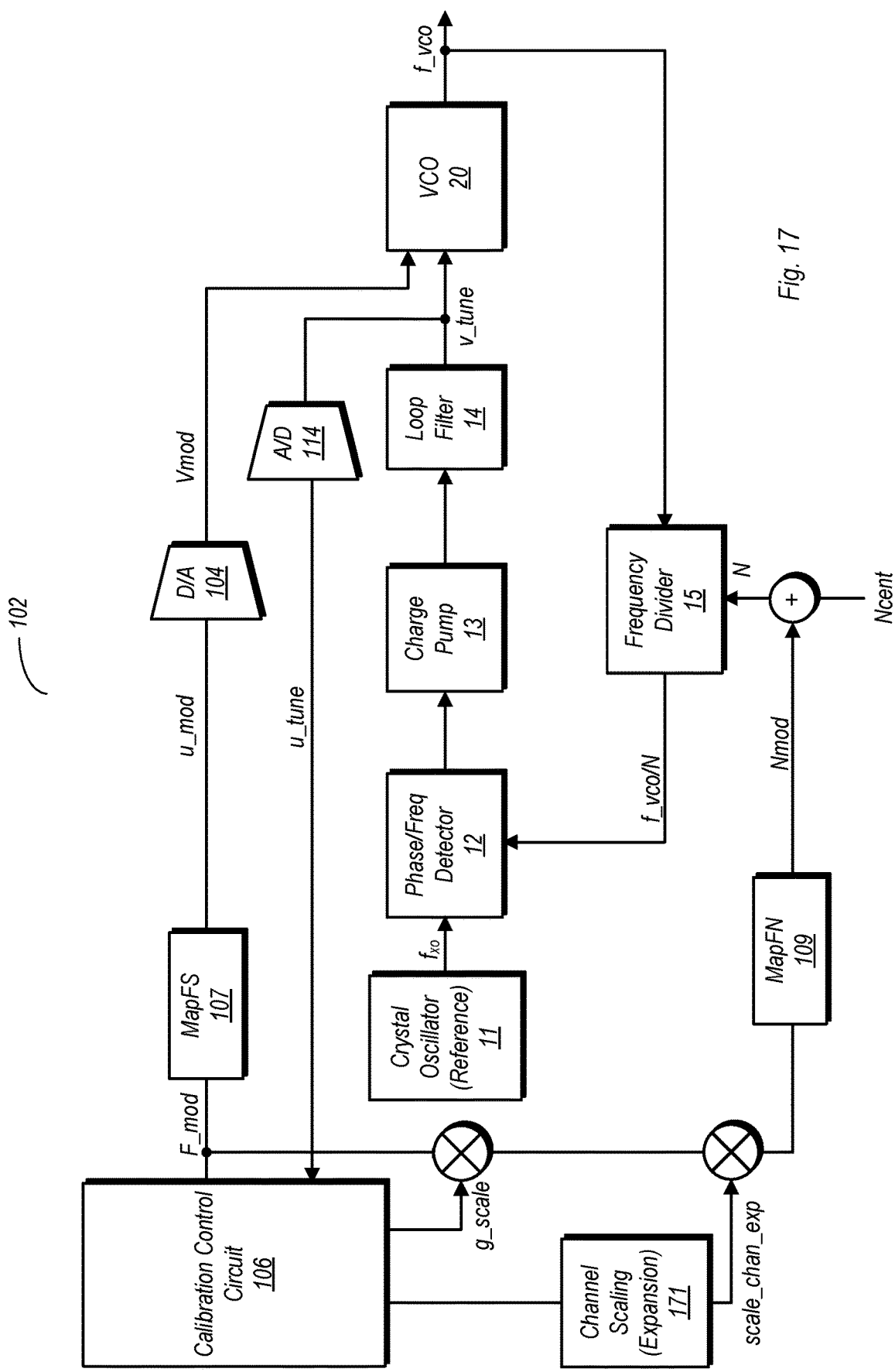
FIG. 17 is a block diagram of another embodiment of a PLL incorporating an embodiment of a VCO, a calibration circuit, and a channel scaling circuit in accordance with this disclosure.

FIG. 17 shows a modified calibration system diagram that takes the place of the structure introduced earlier in FIG. 9. Again, a 4-point approach is assumed, so that F_mod is set to 0 for reference measurements, and to four non-zero offset measurements, one at a time. The difference with respect to the approach outlined in FIG. 9 lies in the fact that now, during the calibration, F_mod feeds through to u_mod (and on to $v_{mod}$) directly, while the path leading to N_mod and on the the PLL's loopback divider is the one undergoing scaling by g_scale and, therefore, gradual adaptation as the tuning voltage difference between each respective reference measurement and the corresponding offset measurement per knot are carried out.

In addition to the elements of the embodiment of FIG. 9, system 102 shown in FIG. 17 includes channel scaling circuit 171, which is coupled to calibration control circuit 106. Channel scaling circuit 171 may apply an additional scale factor to the F_mod signal that represents one of the four knots. This scale factor allows maintaining and adapting a single g_scale variable (per knot) across all channels, as opposed to a separate set of four g_scale quantities, per channel. From FIG. 16 and Eq. (18), it is understood that $k_{v,mod}$ and the VCO characteristic at different center frequencies are deterministically related to one another, per a third-power or other implementation specific (but known a-priori) dependency. This knowledge is exploited by defining, e.g., the lowest channel in the spectrum, such as 2402 MHz in Bluetooth, as the reference channel. Once g_scale is known for the reference channel, it is also known for any other channel: for any specific channel, g_scale from the reference channel merely needs to be scaled up by a factor commensurate with the cubic (other otherwise characterized) expansion of the VCO characteristic versus carrier frequency.

For the cubic case, the channel expansion factor is given by 1.0 for the reference channel at 2402 MHz, and by $(2480/2402)^3 = 1.10$ for the upper end of the spectrum, and values in-between for other carrier frequencies. Therefore, as a function of the hopping channel provided by the calibration control circuit 106 to the channel scaling circuit 171, the latter may look up (e.g., in a pre-populated look up table or LUT) the required scale factor for the requested channel, expands the incoming g_scale-multiplied F_mod by the channel-specific factor, and feeds the resulting signal to the divider in the loopback path of the PLL. It is noted that in various embodiments, this occurs during calibration but not during data path operation, as further discussed below. This approach allows each g_scale quantity (one per knot) to be kept around as only one instantiation across all channels. Any adaptations take place on this one and only g_scale per knot, while the carrier frequency adjustment is accounted for via the channel scaling operation "on the fly". This procedure may exploit the fact that when a certain combination of F_mod and g_scale is a good choice in the reference channel, then from the spectral dependency (say, the one to the third power) it is clear from FIG. 16 that in another channel, F_mod and g_scale*scale_chan_exp is also a good choice, where scale_chan_exp is provided for the desired other channel by the channel scaling circuit 171.

In a procedure similar to the VCO predistortion calibration described above, once the calibration has converged, there are four pairs representing the VCO characteristic (for the reference channel 2402) in four balanced operating points: (F_mod_0/1/2/3, and F_mod_0/1/2/3*g_scale_0/1/2/3, respectively), where the first entry F_mod_i represents the varactor modulation voltage $v_{mod}$ and the second entry F_mod_i*g_scale_i represents the effective frequency shift enforced numerically via the adjustment to the divide ratio N in the loopback path of the PLL. Again, once the calibration has converged, $v_{tune}$ is value-invariant for all measurements, so that the frequency shift induced via Nmod is fully aligned with the voltage $v_{mod}$ injecting into the modulation port of the VCO. Since these four value pairs, therefore, represent valid samples of the VCO characteristic, they lend themselves to coming up with a polynomial description of the VCO behavior of Eq. (17b), $$v_{mod}(f_{mod}) = \Sigma_{k=1}^{4} P_k f_{mod}^k.$$

Here, per the calibration structure in FIG. 17, $v_{mod}$ is a direction function (that is, deterministically scaled version) of the respective knot value F_mod_i for knot Ki. The induced steady-state frequency shift is a function of the knot value F_mod_i multiplied by the converged g_scale_i for this knot Ki.

Figure 18:
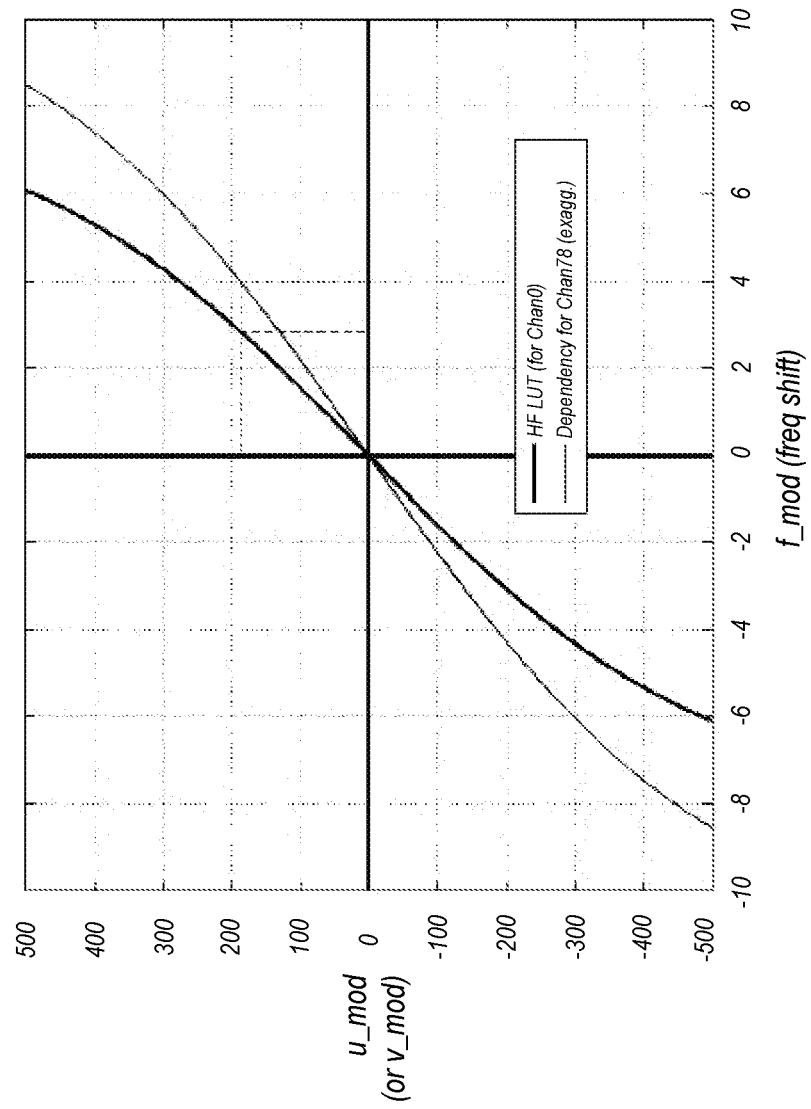
FIG. 18 is a diagram illustrating further characteristics of one embodiment of a VCO, in accordance with this disclosure.

Again, linear algebra may be utilized to solve for four polynomial coefficient representing the VCO characteristic from an output-to-input perspective, where the actual frequency shift is the input of the mapping and the required value feeding to the modulation varactor to achieve balanced conditions is the output. Such a mapping is shown in FIG. 18 for channels 0 and 78 via the indicated curves. The input (x-axis) is the desired frequency shift, the output (y-axis) is the value that needs to be injected to the VCO's modulation varactor (u_mod or v_mod in this particular example).

During data path operation, similarly to the structure of FIG. 15, this mapping can again be accommodated as a predistortion actuation module via direct evaluation of the polynomial formula with known coefficients, for each desired input sample F_mod[k].

FIG. 18, via the dependency between the two curves, also illustrates how a different channel (other than the reference channel 2402) can be accommodated entirely based on the polynomial model of the reference channel. The two curves in FIG. 18, inverse functions of the more traditional perspective for the VCO characteristic shown in FIG. 15, are horizontally scaled with respect to one another. The channel 0 curve (that is, the contents of the predistortion mapping LUT) is known from the calibration procedure for the reference channel 2402. The channel 78 curve is needed so that a look-up can be performed where for a desired frequency shift F_mod[k] (x-axis) the corresponding value that needs to be fed into the u_mod path can be read off. However, this curve (the channel 78 curve) is not directly available.

A simple remedy may be found by exploiting the horizontal scaling between the two curves. The horizontal stretch is again determined by the relative scaling between the VCO curves as a function of the carrier frequency—such as cubic or another circuit-specific dependency. Therefore, to read off the output value (required value for u_mod) for a given F_mod[k], the latter needs to be shrunk (divided) by a suitable Channel Scale factor before the input to the LUT/mapping.

Figure 19:
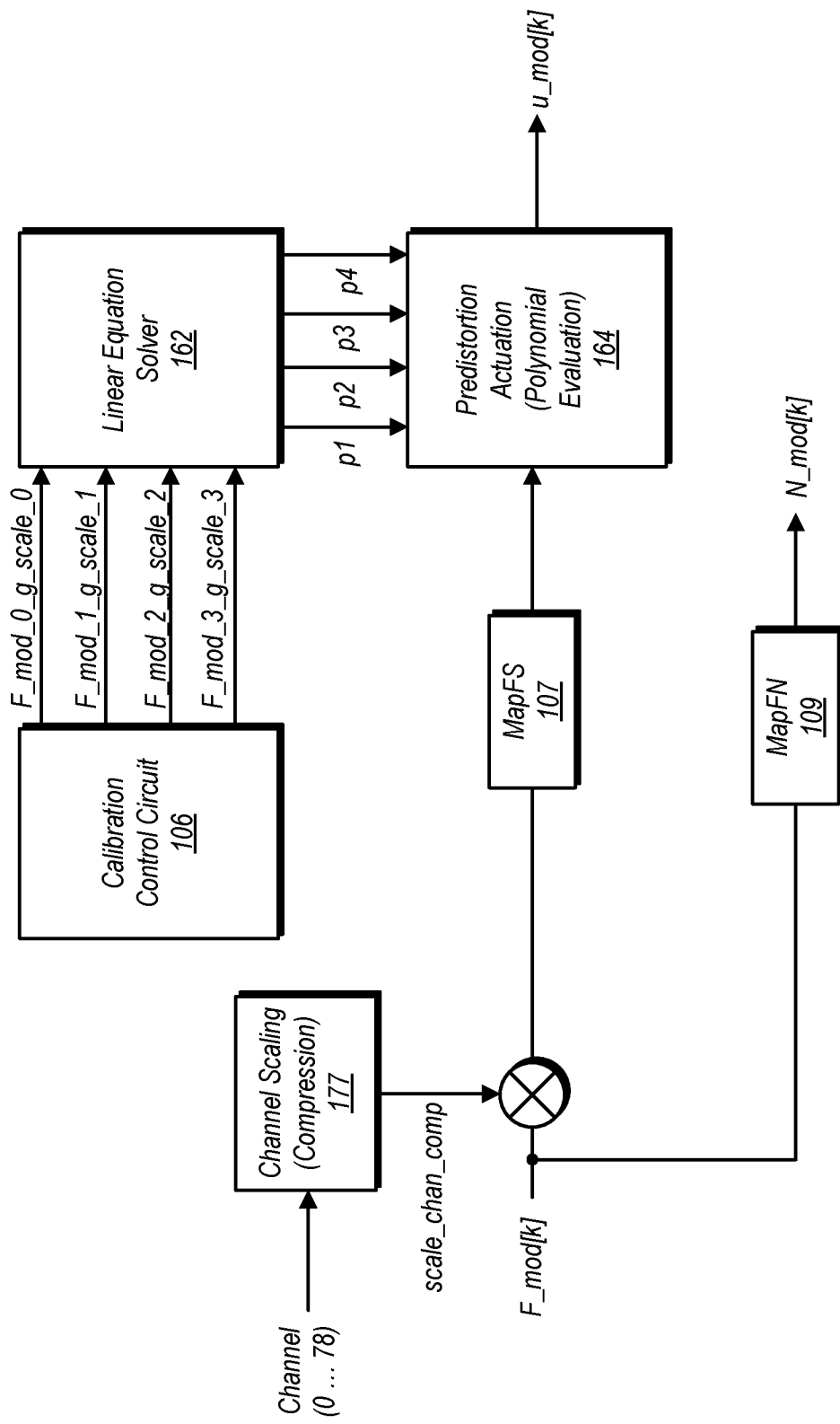
FIG. 19 is a block diagram illustrating how one embodiment of a channel scaling module scales a frequency modulation (F_mod) with a channel-dependent scaling factor.

This procedure may be performed as illustrated by the system diagram in FIG. 19. The computation of the polynomial model may be performed by linear equation solver 162, and may occur just after the calibration performed by the calibration control circuit 106. The channel scaling in this embodiment may be performed by channel scaling (compression) module 177 (which may be implemented using hardware/circuitry, software, firmware, or any suitable combination thereof). The arrangement of FIG. 19 illustrates how each sample F_mod[k] may be compressed by the channel specific scale factor provided by the channel scaling (compression) module 177. In this particular embodiment, the scaling entries provided by the latter under the assumption of a cubic dependency will be 1.0 for channel 0, 1/1.10 for channel 78 (2480 MHz), and values (2402/F_channel)$^3$ for the general case, where F_channel is the desired carrier frequency on {2402 . . . 2480} MHz.

Figure 20:
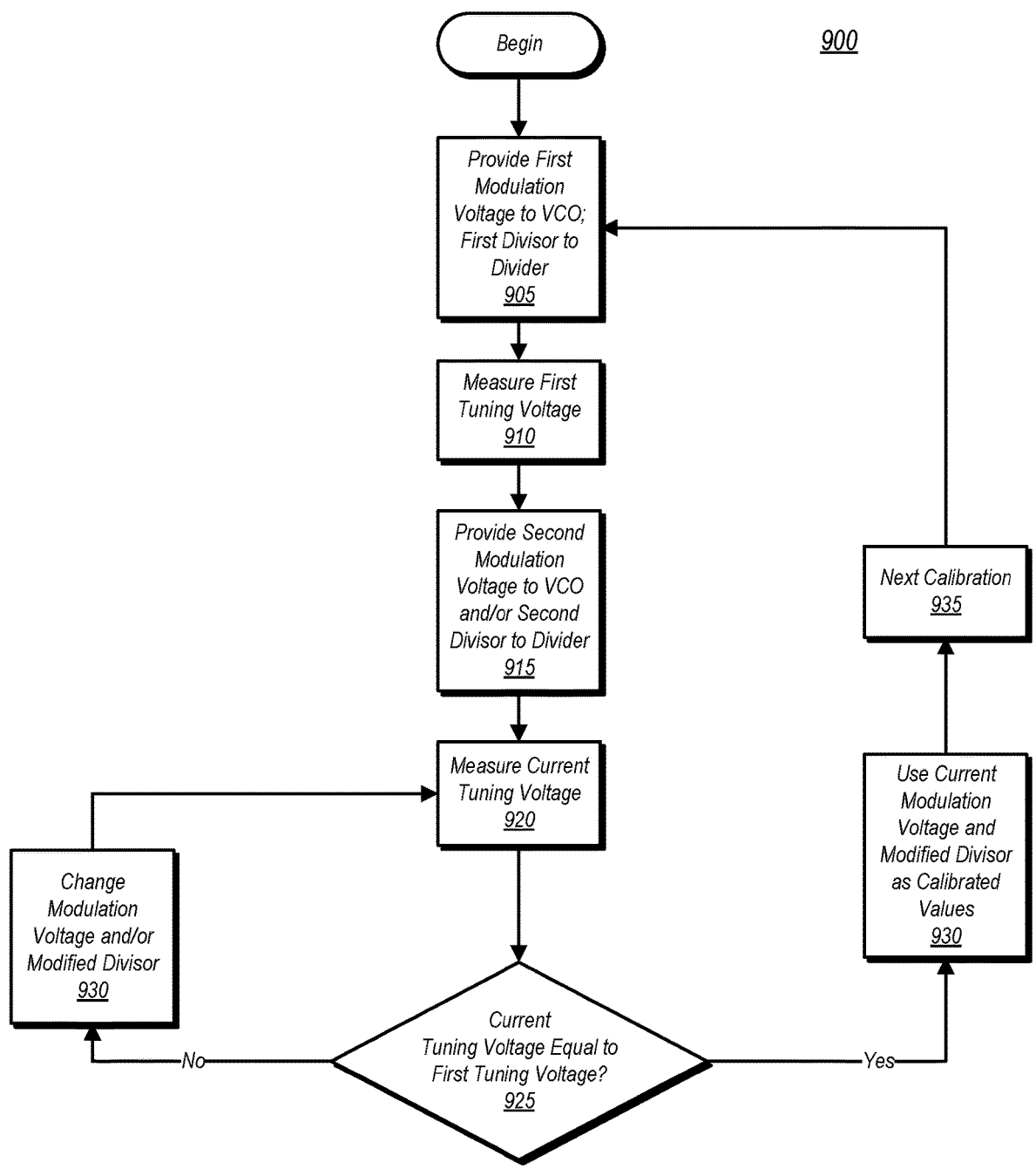
FIG. 20 a flow diagram illustrating one embodiment of a method for calibrating a VCO in accordance with this disclosure.

Basic Calibration Methodology:

FIG. 20 is a flow diagram illustrating one embodiment of a method for performing a calibration of a VCO. Method 900 may be performed with various ones of the hardware embodiments discussed above, as well as with other hardware embodiments not explicitly disclosed herein. Furthermore, while method 900 is discussed in the context of a VCO implemented in a PLL, embodiments of the method are contemplated in which the VCO is implemented in other types of circuits. Such embodiments thus fall within the scope of this disclosure. Generally speaking, method 900 as outlined in FIG. 20 may be a fundamental calibration upon which the other methodologies discussed above may be built.

It is further noted that embodiment of method 900 disclosed herein may apply to an initial calibration of the VCO that is performed in, e.g., a factory environment, or a tracking calibration that is performed during the operation of the system in which the VCO is implemented. Furthermore, while the calibration methodology described herein may be performed as an iterative process, it is noted that it does not necessarily need to be performed in an uninterrupted manner. For example, in a tracking calibration scenario, as few as a single iteration may be performed between individual transmissions of packets in an embodiment in which the VCO is implemented in a wireless communications system such as that previously discussed herein. Moreover, in some instances, such as in the tracking calibration scenario, the calibration may be accomplished in as little as a single iteration.

The calibration procedure of method 900 begins with an iteration in which a first modulation voltage is provided to the VCO while a first divisor is provided to the divider of the PLL (block 905). The modulation voltage, as noted above, may be an additional voltage applied to the VCO along with a tuning voltage that is provided from, e.g., a loop filter in a PLL. The frequency of a signal output by the VCO may be based on both the tuning voltage provided by the loop filter and the modulation voltage. If the calibration is an initial calibration (e.g., performed in a factory), an initial modulation voltage of zero volts may be applied as the first modulation voltage. In a tracking calibration scenario, the first modulation voltage may be a non-zero voltage, such as a most recently used value of modulation voltage.

After applying the initial modulation voltage, non-zero or otherwise, a first measurement of the tuning voltage is performed (block 910). In one embodiment, such as one carried out by the apparatus shown in FIG. 2, the tuning voltage is converted to a digital value and provided to a control circuit. The digital value of the tuning voltage may then be saved for use in future comparisons and calculations.

The calibration methodology then continues by providing another modulation voltage to the VCO and/or a modified divisor value to the divider (block 915). This value of the modulation voltage may be a non-zero value in both the initial (e.g., factory) calibration scenario, as well as in the tracking calibration scenario. The modulation voltage, in combination with the tuning voltage, changes the capacitance of the LC tank in the VCO, thereby resulting in a change of output frequency that is substantially instantaneous. In some instances, both the modulation voltage and the divisor may be changed on a single iteration. In other instances, iterations may be conducted in which only one of the modulation voltage and divisor are changed.

After allowing sufficient time for the loop of the PLL to stabilize, another measurement of the tuning voltage is performed (block 920). A difference between measured value from this part of the method and the first measured value of the tuning voltage is then calculated. If the difference between the current tuning voltage and the initially measured tuning voltage is substantially zero (block 925, yes), then the modulation voltage and divisor values that produced the current tuning are used as calibrated values (block 930). These calibrated values of the modulation voltage and the divisor may be used to produce the desired frequency shift during normal operation until commencement of the next calibration cycle (block 935). Upon beginning a new calibration cycle, the method returns to block 905.

If the current tuning voltage is not substantially equal to the initially measured tuning voltage (block 925, no) then at least one of the modulation voltage and value of the modified divisor are changed (block 930) and another iteration is performed.

In various embodiments, the amount of change applied to the modulation voltage and/or modified divisor for a subsequent iteration is dependent upon the determined difference between the initial (or first) and current tuning voltage. The direction of the change may also be dependent on the determined difference between the initial (or first) tuning voltage. Thus, for example, a modulation voltage for a subsequent iteration may be increased or decreased. Similarly, the modified divisor, if changed for a given iteration, may be increased or decreased.

Iterations may be performed until the difference between the most recently measured tuning voltage and the initial (or first) tuning voltage is zero or substantially zero such that the two voltages are equal to one another. One of ordinary skill in the art would understand that voltages may be considered equal if there are negligible differences between the voltages. In some instances, voltages may be considered equal if they are within some predetermined threshold from one another. This threshold may be expressed as a percentage value, or as an absolute voltage value, or other suitable metric/parameter. In one instance, first and second voltages are considered equal if the second voltage is within +/−1% of the initial/first voltage. An exemplary absolute value may be when the tuning voltage for an iteration is within, e.g., 5 millivolts of the initial/first tuning voltage value (or, to put another way, the difference is no more than, e.g., 5 millivolts). The tuning voltages may also be considered equal if a change of tuning voltages by a calculated difference is small enough such that there is little to no effect on the stability of the PLL loop, as determined by a suitable metric or parameter.

The goal of the method as performed here is to be able to shift the frequency of the VCO output signal by a specified amount in a manner that is for all intents and purposes instantaneous and in which the stability of the PLL loop is maintained (i.e. does not require any significant settling time). This may be accomplished by applying the correct values of the modulation voltage and modified divisor to the VCO and the divider circuit, respectively. In the various embodiments discussed above, making a determination of the correct values of the modulation voltage and modified divisor to obtain the desired frequency shift effectively results in the determination of the correct scaling factors applied in the modulation voltage and modified divisor paths, respectively.

It is noted that in some embodiments of the method described herein, a "re-zeroing" may occur between iterations. That is, between the application of a non-zero modulation voltage and a modified divisor for two consecutive iterations, an intervening application of the zero modulation voltage and an unmodified divisor may be performed. During these intervening applications of the zero modulation voltage and unmodified divisor, the tuning voltage may be re-measured to provide a basis for comparison in either a most recently completed iteration or a subsequent iteration.

Numerous variations and modifications will become apparent to those skilled in the art once the above disclosure is fully appreciated. It is intended that the following claims be interpreted to embrace all such variations and modifications.

What is claimed is:

1. A method comprising:
   measuring a first value of a tuning voltage applied to a voltage-controlled oscillator (VCO) of a phase-locked loop (PLL);
   providing a modulation voltage value and a divisor value to the PLL to cause a second value of a tuning voltage to be applied to the VCO;
   determining a difference between the second value of the tuning voltage and the first value of the tuning voltage;
   providing at least one of a modified modulation voltage value or a modified divisor value to the PLL when the second value of the tuning voltage and the first value of the tuning voltage are not equal, wherein the at least one of the modified modulation voltage value or the modified divisor value provided is based on the difference between the second value of the tuning voltage and the first value of the tuning voltage; and
   providing a zero value of the modulation voltage and an unmodified value of the divisor to the PLL between iterations in which at least one of the modified modulation voltage value and modified divisor value are provided.

2. The method as recited in claim 1, further comprising providing a modulation voltage based on the modulation voltage value to the VCO, wherein the first value of the tuning voltage is based in part on a modulation voltage of zero volts applied to the VCO.

3. The method as recited in claim 2, wherein the second value of the tuning voltage is based on a non-zero value of modified modulation voltage provided to the PLL.

4. The method as recited in claim 1, further comprising providing the divisor corresponding to the divisor value to a divider circuit of the PLL, wherein the first value of the tuning voltage is based in part on a first value of the divisor.

5. The method as recited in claim 4, wherein the second value of the tuning voltage is based in part on a modified value of the divisor.

6. The method as recited in claim 1, further comprising:
- a calibration control circuit causing generation of the modulation voltage;
- the calibration control circuit measuring the difference between the first value of the tuning voltage and the second value of the tuning voltage and differences between subsequent values of the tuning voltage over subsequent iterations; and
- a calibration control circuit causing at least one of the modified divisor value or the modified voltage to be provided to the PLL.

7. The method as recited in claim 1, wherein responsive to determining that, for a most recent iteration, an updated value of the tuning voltage and the first value of the tuning voltage are equal, using the modified modulation voltage value and the modified divisor value applied in the most recent iteration as calibrated values of the modulation voltage and divisor.

8. A circuit comprising:
- a phase-locked loop (PLL) having a voltage-controlled oscillator (VCO) configured to generate an output signal having a frequency based on a tuning voltage and a modulation voltage received by the VCO;
- a calibration control circuit configured to perform a calibration of the VCO, wherein performing the calibration comprises the calibration control circuit:
  - measuring a first value of a tuning voltage applied to the VCO;
  - causing a modulation voltage value and a divisor value to be provided to the PLL to cause a second value of a tuning voltage to be applied to the VCO;
  - determining a difference between the second value of the tuning voltage and the first value of the tuning voltage; and
  - causing at least one of a modified modulation voltage or a modified divisor value to be provided to the PLL when the second value of the tuning voltage and the first value of the tuning voltage are not equal, wherein the at least one of the modified modulation voltage value or the modified divisor value provided is based on the difference between the second value of the tuning voltage and the first value of the tuning voltage;
  - wherein the calibration control circuit is further configured to provide a zero value of the modulation voltage and an unmodified value of the divisor to the PLL between iterative adjustments to at least one of the modulation voltage and a divisor.

9. The circuit as recited in claim 8, wherein the calibration control circuit is configured to cause a modulation voltage based on the modulation voltage value to be applied to the VCO, wherein the first value of the tuning voltage is based in part on a modulation voltage of zero volts applied to the VCO.

10. The circuit as recited in claim 9, wherein the second value of the tuning voltage is based on a non-zero value of modified modulation voltage provided to the PLL.

11. The circuit as recited in claim 8, wherein the calibration control circuit is configured to provide modified values of either of the modulation voltage and divisor to the PLL responsive to determining that, for a most recent iteration, an updated value of the tuning voltage and the first value of the turning voltage are equal.

12. The circuit as recited in claim 11, wherein the calibration control circuit is configured to provide the divisor corresponding to the divisor value to a divider circuit of the PLL, wherein the first value of the tuning voltage is based in part on a first value of the divisor.

13. The circuit as recited in claim 8, wherein the VCO is coupled to receive the tuning voltage from a loop filter, and wherein the circuit further comprises an analog-to-digital converter coupled to receive the tuning voltage and provide a digital equivalent thereof to the calibration control circuit.

14. The circuit as recited in claim 8, wherein the calibration control circuit is configured to generate a digital modification value, wherein the modified values of the modulation voltage and the modified values of the divisor are generated based at least in part on the digital modification value.

15. A wireless transmitter comprising:
- a digital signal processing unit coupled to receive a digital data stream;
- an analog signal processing unit coupled to receive, from the digital signal processing unit, amplitude and frequency information based on data in the digital data stream, wherein the analog signal processing unit includes:
  - a phase-locked loop (PLL) having a voltage-controlled oscillator (VCO) configured to generate an output signal having a frequency based on a tuning voltage and a modulation voltage received by the VCO; and
  - a calibration control circuit configured to perform a calibration of the VCO, wherein performing the calibration includes the calibration control circuit causing iterative adjustments to at least one of the modulation voltage and a divisor received by a divider of the PLL to produce an updated tuning voltage, wherein the updated tuning voltage is based on adjusted values of the modulation voltage and the divisor, and wherein an amount of adjustment applied to at least one of the modulation voltage and the divisor for a subsequent iteration is based on a difference between the updated tuning voltage a first tuning voltage, wherein the calibration control circuit is further configured provide a zero value of the modulation voltage and an unmodified value of the divisor to the PLL between iterative adjustments to at least one of the modulation voltage and a divisor.

16. The wireless transmitter as recited in claim 15, wherein the calibration control circuit is configured to:
- measure a value of the first tuning voltage;
- cause modified values of at least one of the modulation voltage and a divisor to be provided to the VCO and a divider of the PLL, respectively, to cause a first updated value of the tuning voltage to be generated;
- measure the first updated value of the tuning voltage; and
- if the first updated value of tuning voltage and the first value of the first tuning voltage are not equal, repeat causing modified values of at least one of the modulation voltage and divisor to be provided to the VCO and a divider of the PLL, respectively; and responsive to determining that, for a most recent iteration, a currently updated value of the tuning voltage and the first tuning voltage are equal, use a current modulation voltage value and a current divisor value as applied in the most recent iteration as calibrated values of the modulation voltage and divisor.

17. The wireless transmitter as recited in claim 15, wherein the calibration control circuit is configured to output a digital representation of a desired frequency shift, wherein the modulation voltage and the divisor are generated based at least on the digital representation of the desired frequency shift.

\* \* \* \* \*